(12) United States Patent
Luan et al.

(10) Patent No.: US 11,988,743 B2
(45) Date of Patent: May 21, 2024

(54) MOLDED PROXIMITY SENSOR

(71) Applicant: STMICROELECTRONICS PTE LTD, Singapore (SG)

(72) Inventors: Jing-En Luan, Singapore (SG); Jerome Teysseyre, Ang Mo Kio (SG)

(73) Assignee: STMICROELECTRONICS PTE LTD, Singapore (SG)

( * ) Notice: Subject to any disclaimer, the term of this patent is extended or adjusted under 35 U.S.C. 154(b) by 0 days.

(21) Appl. No.: 18/055,138

(22) Filed: Nov. 14, 2022

(65) Prior Publication Data
US 2023/0071048 A1 Mar. 9, 2023

Related U.S. Application Data

(63) Continuation of application No. 16/562,189, filed on Sep. 5, 2019, now Pat. No. 11,513,220, which is a (Continued)

(30) Foreign Application Priority Data

Dec. 24, 2014 (CN) .......................... 201410831009.7
Dec. 25, 2014 (CN) .......................... 201410833225.5

(51) Int. Cl.
*G01S 17/04* (2020.01)
*G01S 7/481* (2006.01)
(Continued)

(52) U.S. Cl.
CPC ............ *G01S 17/04* (2020.01); *G01S 7/4813* (2013.01); *H01L 25/167* (2013.01);
(Continued)

(58) Field of Classification Search
CPC ..... G01S 7/4813; G01S 17/04; H01L 25/167; H01L 31/173
See application file for complete search history.

(56) References Cited

U.S. PATENT DOCUMENTS

| 4,344,809 A | 8/1982 | Wensink |
| 5,108,951 A | 4/1992 | Chen et al. |

(Continued)

FOREIGN PATENT DOCUMENTS

| CN | 103383457 A | 11/2013 |
| CN | 103681649 A | 3/2014 |

(Continued)

*Primary Examiner* — Kevin K Pyo
(74) *Attorney, Agent, or Firm* — Seed IP Law Group LLP

(57) ABSTRACT

A proximity sensor includes a printed circuit board substrate, a semiconductor die, electrical connectors, a lens, a light emitting assembly, and an encapsulating layer. The semiconductor die is positioned over the printed circuit board substrate with its upper surface facing away from the printed circuit board substrate. Each of the electrical connectors is in electrical communication with a contact pad of the semiconductor die and a respective contact pad of the printed circuit board substrate. The lens is positioned over a sensor area of the semiconductor die. The light emitting assembly includes a light emitting device having a light emitting area, a lens positioned over the light emitting area, and contact pads facing the printed circuit board substrate. The encapsulating layer is positioned on the printed circuit board substrate, at least one of the electrical connectors, the semiconductor die, the lens, and the light emitting assembly.

20 Claims, 14 Drawing Sheets

Related U.S. Application Data continuation of application No. 14/674,650, filed on Mar. 31, 2015, now Pat. No. 10,429,509.

(51) Int. Cl.
*H01L 25/16* (2023.01)
*H01L 31/173* (2006.01)

(52) U.S. Cl.
CPC ........ *H01L 31/173* (2013.01); *H01L 2224/16* (2013.01); *H01L 2224/32225* (2013.01); *H01L 2224/48091* (2013.01); *H01L 2224/48227* (2013.01); *H01L 2224/73265* (2013.01); *H01L 2224/92227* (2013.01); *H01L 2224/97* (2013.01); *H01L 2924/181* (2013.01)

(56) References Cited

U.S. PATENT DOCUMENTS

| | | | |
|---|---|---|---|
| 5,930,673 | A | 7/1999 | Chen et al. |
| 6,265,275 | B1 | 7/2001 | Marty et al. |
| 6,392,294 | B1 | 5/2002 | Yamaguchi |
| 6,781,231 | B2 | 8/2004 | Minervini |
| 7,166,910 | B2 | 1/2007 | Minervini |
| 7,242,089 | B2 | 7/2007 | Minervini |
| 7,242,189 | B2 | 7/2007 | Sugimoto |
| 7,381,589 | B2 | 6/2008 | Minervini |
| 7,434,305 | B2 | 10/2008 | Minervini |
| 7,439,616 | B2 | 10/2008 | Minervini |
| 7,537,964 | B2 | 5/2009 | Minervini |
| 7,616,451 | B2 | 11/2009 | Ziglioli et al. |
| 8,018,049 | B2 | 9/2011 | Minervini |
| 8,143,608 | B2 | 3/2012 | Yao et al. |
| 8,217,482 | B2 | 7/2012 | Basoor et al. |
| 9,136,258 | B1 | 9/2015 | Wang et al. |
| 9,140,600 | B2 | 9/2015 | Chang et al. |
| 2003/0029915 | A1 | 2/2003 | Barkan et al. |
| 2006/0237540 | A1 | 10/2006 | Saxena et al. |
| 2007/0235743 | A1 | 10/2007 | Lee et al. |
| 2009/0057864 | A1 | 3/2009 | Choi et al. |
| 2009/0159900 | A1 | 6/2009 | Basoor et al. |
| 2011/0297832 | A1 | 12/2011 | Yao et al. |
| 2012/0086018 | A1 | 4/2012 | Yao et al. |
| 2012/0236568 | A1 | 9/2012 | Lee et al. |
| 2013/0020588 | A1 | 1/2013 | Yong et al. |
| 2013/0164867 | A1 | 6/2013 | Ramasamy et al. |
| 2013/0168722 | A1 | 7/2013 | Lai |
| 2013/0292553 | A1 | 11/2013 | Chang et al. |
| 2013/0292706 | A1 | 11/2013 | Costello et al. |
| 2013/0327931 | A1 | 12/2013 | Hsu et al. |
| 2014/0061444 | A1 | 3/2014 | Wang et al. |
| 2014/0223734 | A1 | 8/2014 | Song et al. |
| 2014/0252209 | A1 | 9/2014 | Land et al. |
| 2014/0319548 | A1 | 10/2014 | Luan |
| 2017/0052277 | A1* | 2/2017 | Wong ................ G01V 8/12 |

FOREIGN PATENT DOCUMENTS

| | | |
|---|---|---|
| CN | 103837174 A | 6/2014 |
| TW | 201428982 A | 7/2014 |
| TW | 201435379 A | 9/2014 |
| WO | WO 2014137561 A1 | 9/2014 |

* cited by examiner

MOLDED PROXIMITY SENSOR

BACKGROUND

Technical Field

The present application generally relates to semiconductor devices, and more particularly to semiconductor proximity sensor devices.

Description of the Related Art

FIG. 1A is a top plan view of a conventional proximity sensor 100. The proximity sensor 100 includes a cap 102 having a first aperture 104 and a second aperture 106 formed therein. FIG. 1B is a cross-sectional view of the proximity sensor 100 along the line IB-IB shown in FIG. 1A. The proximity sensor 100 includes a light emitting device 108 and a semiconductor die 110 disposed on a printed circuit board substrate 112. A sensor area 114 is disposed on an upper surface of the semiconductor die 110. A lens 116 is secured to the semiconductor die 110 above the sensor area 114 using a transparent adhesive material 118. Alternatively, a pair of the lenses 116 may be secured to the cap 102 using an adhesive such that light passing through the first aperture 104 and the second aperture 106 also passes through the lenses 116. The light emitting device 108 emits light through the first aperture 104. The light emitted by the light emitting device 108 that is reflected by an object in the vicinity of the proximity sensor 100 may enter the second aperture 106, travel through the lens 116, and impact the sensor area 114. The proximity sensor 100 outputs a signal indicative of the intensity of light that is incident on the sensor area 114.

As shown in FIG. 1B, the cap 102 includes a first cap piece 102a, a second cap piece 102b, and a third cap piece 102c. The cap pieces 102a-102c are extremely small, generally having dimensions between 15 micrometers and 150 micrometers. The first cap piece 102a is secured to the printed circuit board substrate 112 using an adhesive material 120a. The second cap piece 102b is secured to the semiconductor die 110 using an adhesive material 120b. The third cap piece 102c is secured to the printed circuit board substrate 112 using an adhesive material 120c.

During fabrication of the proximity sensor 100, the adhesive material 120a and the adhesive material 120c are deposited on an upper surface of the printed circuit board substrate 112, and the adhesive material 120b is deposited on an upper surface of the semiconductor die 110. The tiny cap pieces 102a-102c are carefully positioned on the adhesive materials 120a-120c, respectively. If the cap pieces 102a-102c and/or the adhesive materials 120a-120c are not precisely placed in their intended locations, the cap pieces 102a-102c may not adhere properly and/or may not form the apertures 104 and 106 over the light emitting device 108 and the sensor area 114, respectively. Thus, fabrication of the proximity sensor 100 may result in a high defect rate, which can increase manufacturing costs.

Accordingly, proximity sensor devices that can be fabricated with lower defect rates are needed.

BRIEF SUMMARY

According to an embodiment, a proximity sensor device is provided. The device includes a first printed circuit board substrate, a semiconductor die, a plurality of electrical connectors, a first lens, a light emitting assembly, and an encapsulating layer. The first printed circuit board substrate includes a first plurality of contact pads on a first side of the first printed circuit board substrate. The semiconductor die includes a sensor area on an upper surface and a second plurality of contact pads. The semiconductor die is positioned over the first printed circuit board substrate with its upper surface facing away from the first printed circuit board substrate. Each of the electrical connectors is in electrical communication with one of the second plurality of contact pads and a respective one of the first plurality of contact pads. The first lens is positioned over the sensor area of the semiconductor die. The light emitting assembly includes a light emitting device having a light emitting area, a second lens positioned over the light emitting area, and a third plurality of contact pads facing the first printed circuit board substrate. The encapsulating layer is positioned on the first printed circuit board substrate, at least one of the plurality of electrical connectors, the semiconductor die, the first lens, and the light emitting assembly.

According to another embodiment, a proximity sensor is provided. The proximity sensor includes an encapsulating layer, a plurality of cap feet, a plurality of lenses, a light emitting device, and a semiconductor die. The encapsulating layer has a first side and a second side. The cap feet are in contact with and extend from the first side of the encapsulating layer. Each of the lenses has a first side and a second side. The encapsulating layer is in contact with the first side and the second side of each of the lenses. The light emitting device is disposed below a first one of the lenses. The semiconductor die includes a sensor area that disposed below a second one of the lenses.

According to yet another embodiment, a method for manufacturing a proximity sensor device is provided. According to the method, a semiconductor die is positioned on a first side of a first printed circuit board substrate. A first plurality of electrical connections is formed between the semiconductor die and the first printed circuit board substrate. A first lens is positioned over a sensor area of the semiconductor die. The first lens is attached to the semiconductor die. A light emitting assembly is positioned on the first side of the first printed circuit board substrate. The light emitting assembly includes a light emitting device and a second lens positioned over a light emitting area of the light emitting device. A second plurality of electrical connections is formed between the light emitting assembly and the first printed circuit board substrate. An encapsulating layer is formed on the first printed circuit board substrate, at least one of the second plurality of electrical connections, the semiconductor die, the first lens, and the light emitting assembly.

DETAILED DESCRIPTION

Figure 1A:
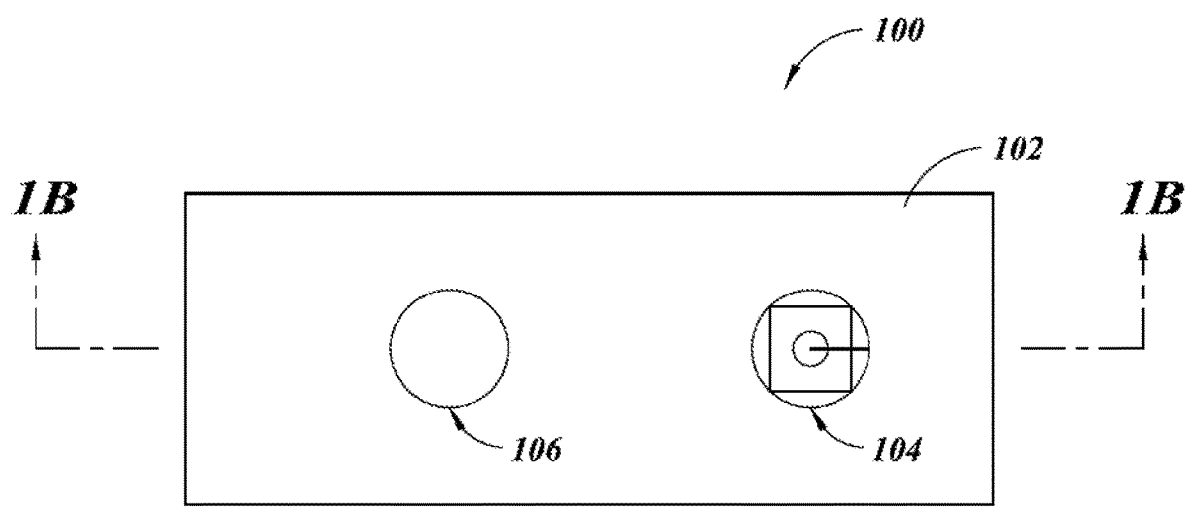
FIG. 1A is a top plan view of a conventional proximity sensor.
Figure 1B:
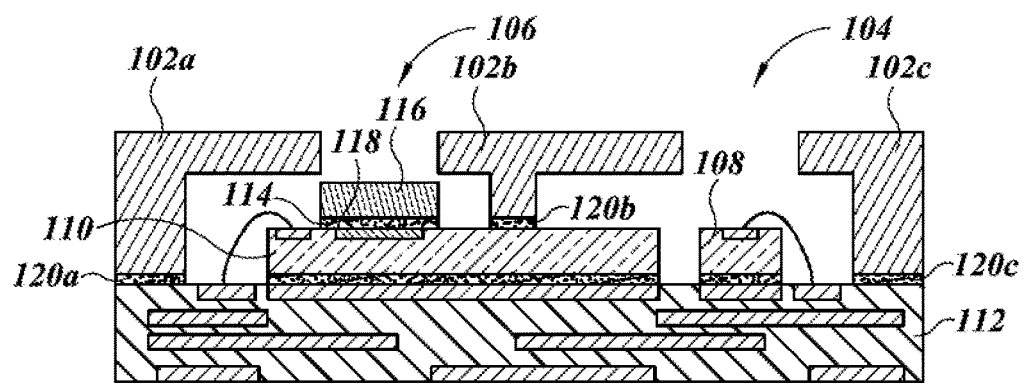
FIG. 1B is a cross-sectional view of the proximity sensor shown in FIG. 1A.
Figure 2A:
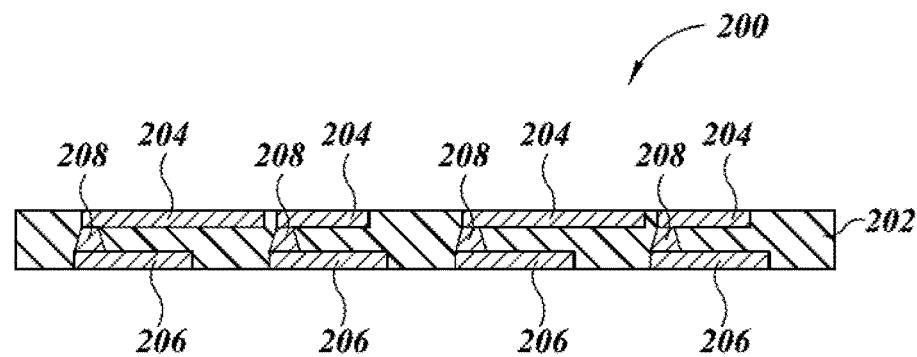
FIGS. 2A-2D show a semiconductor assembly at various stages of fabrication, according to one embodiment.

FIGS. 2A-2D show a semiconductor assembly 200 at various stages of fabrication, according to one embodiment. As shown in FIG. 2A, the semiconductor assembly 200 includes a printed circuit board substrate 202. An upper surface of the printed circuit board substrate 202 includes a plurality of contact pads 204. A lower surface of the printed circuit board substrate 202 includes a plurality of contact pads 206. A plurality conductive traces 208 form electrical connections between one or more of the contact pads 204 on the upper surface of the printed circuit board substrate 202 and one or more of the contact pads 206 on the lower surface of the printed circuit board substrate 202.

Figure 2B:
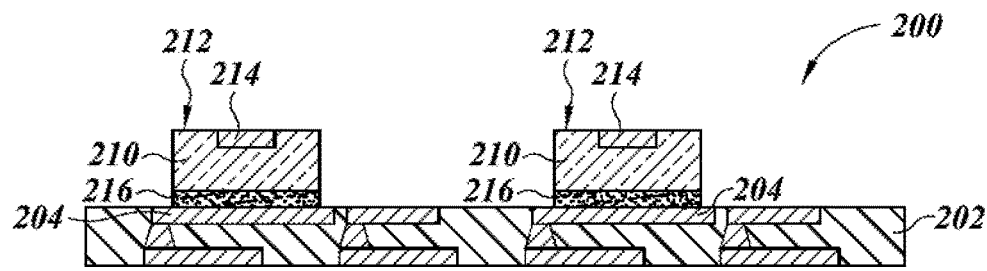

As shown in FIG. 2B, a plurality of light emitting devices 210 is placed over the upper surface of the printed circuit board substrate 202. In one embodiment, each of the light emitting devices 210 is a conventional light emitting diode (LED). In one embodiment, each of the light emitting devices 210 is a conventional vertical-cavity surface-emitting laser (VCSEL).

An upper surface of each light emitting device 210 includes a light emitting area 212 and a contact pad 214. A conventional conductive adhesive material 216 forms an electrical connection between a lower surface of each light emitting device 210 and one of the contact pads 204 on the upper surface of the printed circuit board substrate 202. The conductive adhesive material 216 secures each light emitting device 210 to the upper surface of the printed circuit board substrate 202.

In one embodiment, the conductive adhesive material 216 is formed on predetermined ones of the contact pads 204 on the upper surface of the printed circuit board substrate 202 and then the lower surfaces of the light emitting devices 210 are placed in contact with the conductive adhesive material 216. In one embodiment, at least part of the lower surface of each of the light emitting devices 210 is coated with the conductive adhesive material 216, which is then placed in contact with a predetermined one of the contact pads 204 on the upper surface of the printed circuit board substrate 202. For example, pick-and-place machinery employing conventional surface mount technology may be used to place the light emitting devices 210 on the upper surface of the printed circuit board substrate 202.

Figure 2C:
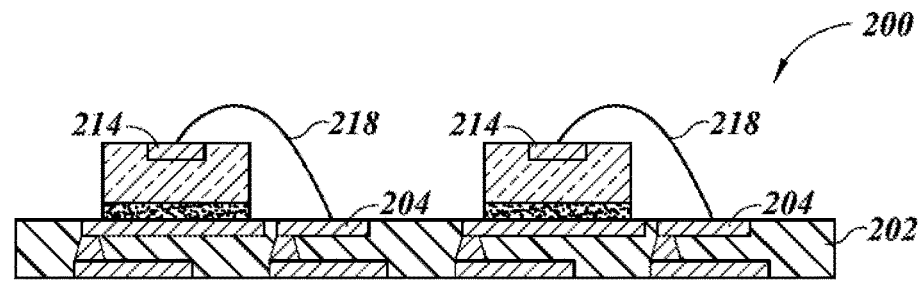

As shown in FIG. 2C, electrical connections are then formed between the contact pads 214 on the upper surfaces of the light emitting devices 210 and corresponding contact pads 204 on the upper surface of the printed circuit board substrate 202. In one embodiment, conventional wire bonding machinery connects one end of each of a plurality of wires 218 to one of the contact pads 204 on the upper surface of the printed circuit board substrate 202 and then connects the other end of the wire 218 to one of the contact pads 214 on the upper surface of a respective one of the light emitting devices 210.

Figure 2D:
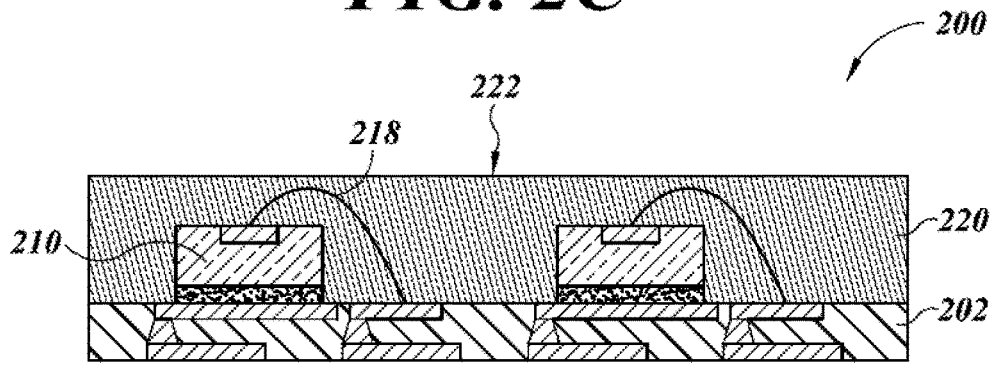

As shown in FIG. 2D, a layer of a conventional transparent material 220 is then formed on the upper surface of the printed circuit board substrate 202 and upper and side surfaces of each of the light emitting devices 210 and the wires 218. Initially, the transparent material 220 may be in a liquid or gel form and may be poured or injected over the printed circuit board substrate 202, the light emitting devices 210, and the wires 218. The transparent material 220 may then be cured with UV light, heat, and/or moisture to cause the transparent material 220 to take a solid form more quickly.

The transparent material 220 may enable most, if not all, of the light incident on the transparent material 220 to pass therethrough. For example, the transparent material 220 may enable at least 85% of the light in the visible spectrum (e.g., wavelengths of light from approximately 400 nanometers to 700 nanometers) or light in the infrared spectrum (e.g., wavelengths of light from approximately 700 nanometers to 1250 nanometers) that is incident on the transparent material 220 to pass therethrough. Additionally or alternatively, the transparent material 220 may act as a filter that prevents predetermined wavelengths of light from passing therethrough. For example, the transparent material 220 may prevent light in the visible spectrum or light in the infrared spectrum that is incident on the transparent material 220 from passing therethrough.

Figure 3:
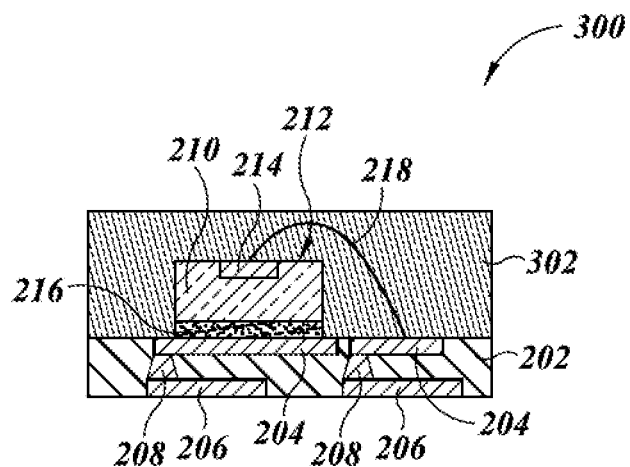
FIG. 3 is a cross-sectional view of a light emitting assembly, according to one embodiment.

With reference to FIGS. 2D and 3, the semiconductor assembly 200 is then sawed or otherwise separated to form a plurality of light emitting assemblies 300. For example, the blade of a saw is placed on the upper surface of the semiconductor assembly 200 at the location 222 and then moved downwardly until the blade passes through the layer of the transparent material 220 and the printed circuit board substrate 202.

FIG. 3 is a cross-sectional view of the light emitting assembly 300. The light emitting assembly 300 includes the printed circuit board substrate 202. An upper surface of the printed circuit board substrate 202 includes the contact pads 204. A lower surface of the printed circuit board substrate 202 includes the contact pads 206. The conductive traces 208 form electrical connections between one or more of the contact pads 204 on the upper surface of the printed circuit board substrate 202 and one or more of the contact pads 206 on the lower surface of the printed circuit board substrate 202.

The light emitting device 210 is disposed on the upper surface of the printed circuit board substrate 202. An upper surface of the light emitting device 210 includes the light emitting area 212 and the contact pad 214. The conductive adhesive material 216 forms an electrical connection between a lower surface of the light emitting device 210 and one of the contact pads 204 on the upper surface of the printed circuit board substrate 202. The wire 218 forms an electrical connection between the contact pad 214 on the upper surface of the light emitting device 210 and one of the contact pads 204 on the upper surface of the printed circuit board substrate 202. A lens 302 is formed by the transparent material 220.

Figure 4:
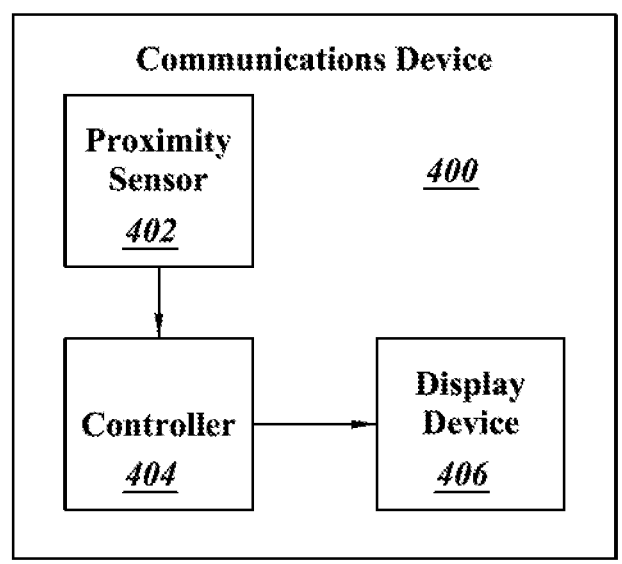
FIG. 4 is a block diagram of a communication device, according to one embodiment.

FIG. 4 is a block diagram of a communication device 400, according to one embodiment. The communication device 400 includes a proximity sensor 402, a controller 404, and a display device 406. In one embodiment, the communication device 400 is a cellular telephone, the proximity sensor 402 is the proximity sensor 600 shown in FIGS. 6A and 6B, and the display device 406 is a touchscreen device. If the proximity sensor 402 is not near the body of a user, for example, the proximity sensor 402 outputs to the controller 404 a first signal indicating that little, if any, light output from the proximity sensor 402 has been reflected from the user's body and returned to the proximity sensor 402. When the controller 404 receives the first signal from the proximity sensor 402, the controller 404 provides to the display device 406 a first control signal that enables the display device 406 and/or causes a back light of the display device 406 to output a predetermined maximum amount of light.

The proximity sensor 402 may be located near a speaker (not shown) of the communication device 400. If the proximity sensor 402 is positioned near the user's body (e.g., the user's ear) the proximity sensor 402 outputs to the controller 404 a second signal indicating that at least a predetermined amount of light output from the proximity sensor 402 has been reflected from the user's body and returned to the proximity sensor 402. When the controller 404 receives the second signal from the proximity sensor 402, the controller 404 provides to the display device 406 a second control signal that disables the display device 406 and/or causes the back light of the display device 406 to output a predetermined minimum amount of light. Accordingly, the proximity sensor 402 may be used to reduce power consumption of the communications device 400.

FIGS. 5A-5E show a semiconductor assembly 500 at various stages of fabrication, according to one embodiment.

Figure 5A:
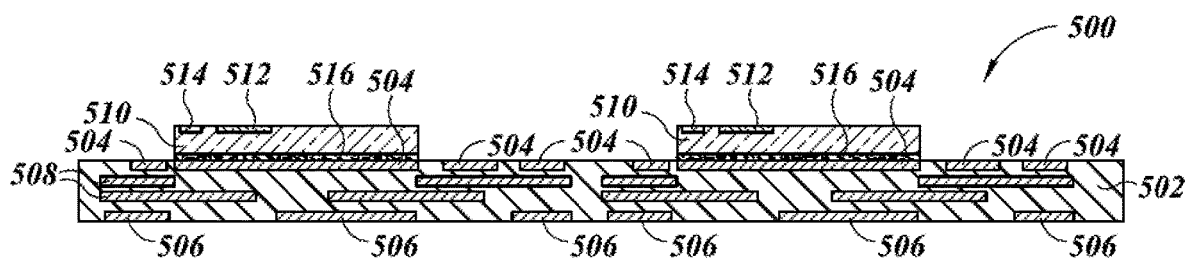
FIGS. 5A-5E show a semiconductor assembly at various stages of fabrication, according to one embodiment.

As shown in FIG. 5A, the semiconductor assembly 500 includes a printed circuit board substrate 502. An upper surface of the printed circuit board substrate 502 includes a plurality of contact pads 504. A lower surface of the printed circuit board substrate 502 includes a plurality of contact pads 506. A plurality conductive traces 508 form electrical connections between one or more of the contact pads 504 on the upper surface of the printed circuit board substrate 502 and one or more of the contact pads 506 on the lower surface of the printed circuit board substrate 502.

A plurality of conventional semiconductor dice 510 is placed over the upper surface of the printed circuit board substrate 502. For example, pick-and-place machinery employing conventional surface mount technology may be used to place the semiconductor dice 510 on the upper surface of the printed circuit board substrate 502. An upper surface of each semiconductor die 510 includes a sensor area 512 and contact pads 514. In one embodiment, the sensor area 512 is part of a photodiode that converts light into current, wherein the magnitude of the current is proportional to the magnitude of the intensity of the light.

Figure 5B:
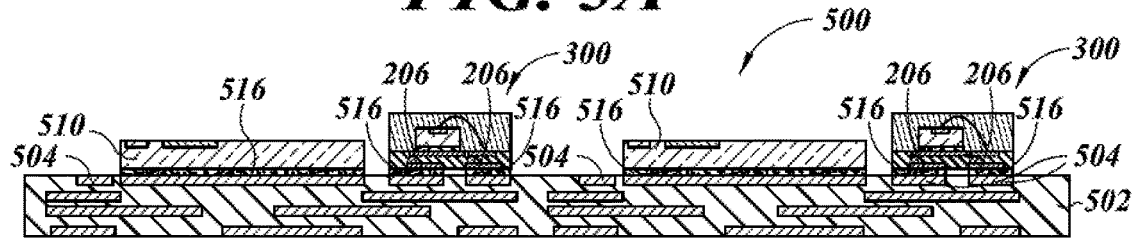

As shown in FIG. 5B, a plurality of the light emitting assemblies 300 is placed over the upper surface of the printed circuit board substrate 502. For example, pick-and-place machinery employing conventional surface mount technology may be used to place the light emitting assemblies 300 over the upper surface of the printed circuit board substrate 502.

A conductive adhesive material 516 secures the semiconductor dice 510 and the light emitting assemblies 300 to the upper surface of the printed circuit board substrate 502. Additionally, the conductive adhesive material 516 forms an electrical connection between the lower surface of each semiconductor die 510 and one of the contact pads 504 on the upper surface of the printed circuit board substrate 502. The conductive adhesive material 516 also forms an electrical connection between each of the contact pads 206 on the lower surface of each light emitting assembly 300 and a respective one of the contact pads 504 on the upper surface of the printed circuit board substrate 502.

Figure 5C:
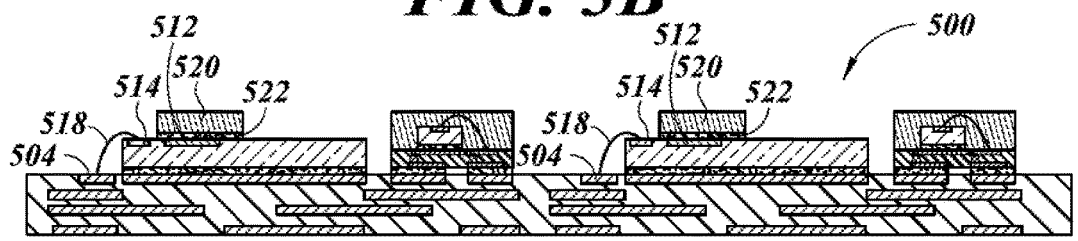

As shown in FIG. 5C, electrical connections are formed between the at least one contact pad 514 on the upper surface of each of the semiconductor dice 510 and respective ones of the contact pads 504 on the upper surface of the printed circuit board substrate 502. In one embodiment, conventional wire bonding machinery connects first ends of the wires 518 to respective ones of the contact pads 504 on the upper surface of the printed circuit board substrate 502 and then connects respective second ends of the wires 518 to a respective one of the at least one contact pad 514 on the upper surfaces of the semiconductor dice 510. Additionally, a plurality of conventional lenses 520 is placed over the sensor areas 512 of the semiconductor dice 510. For example, pick-and-place machinery employing conventional surface mount technology may be used to place each of the lenses 520 on the upper surface of one of the semiconductor dice 510. A conventional transparent adhesive material 522 secures each of the lenses 520 to a respective one of the semiconductor dice 510.

Each of the lenses 520 and/or the transparent adhesive material 522 may enable most, if not all, of the light incident on the lenses 520 and/or the transparent adhesive material 522 to pass therethrough. For example, the lenses 520 and/or the transparent adhesive material 522 may enable at least 85% of the light in the visible spectrum or light in the infrared spectrum that is incident on the lenses 520 and/or the transparent adhesive material 522 to pass therethrough. Additionally or alternatively, the lenses 520 and/or the transparent adhesive material 522 may act as a filter that prevents predetermined wavelengths of light from passing therethrough. For example, the lenses 520 and/or the transparent adhesive material 522 may prevent light in the visible spectrum or light in the infrared spectrum that is incident on the lenses 520 and/or the transparent adhesive material 522 from passing therethrough.

Figure 5D:
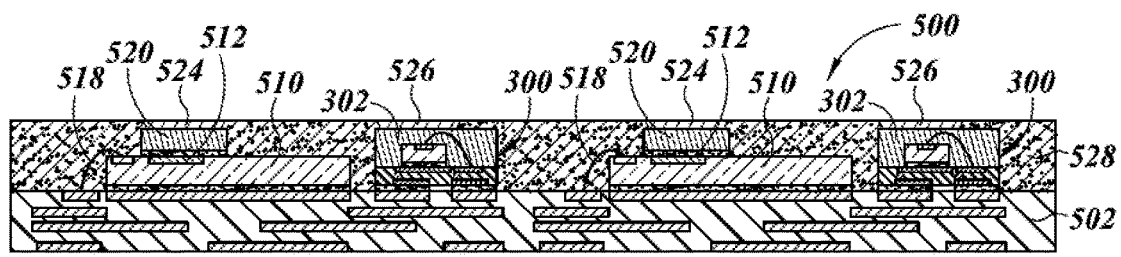

As shown in FIG. 5D, a plurality of masks 524 is positioned over the lenses 520 that are disposed over the sensor areas 512 of the semiconductor dice 510. In addition, a plurality of masks 526 is positioned over the lenses 302 of the light emitting assemblies 300. In one embodiment, a conventional adhesive material (not shown) secures the masks 524 to the lenses 520 and also secures the masks 526 to the lenses 302.

An encapsulating layer 528 is formed on the upper surface of the printed circuit board substrate 502 and upper and side surfaces of each of the semiconductor dice 510, the wires 518, the lenses 520, and the lenses 302, and on side surfaces of the light emitting assemblies 300. The encapsulating layer 528 is formed from a conventional molding compound that does not transmit light therethrough. For example, the encapsulating layer 528 may be formed from a black material. Initially, the encapsulating layer 528 may be in a liquid or gel form and may be poured or injected over the printed circuit board substrate 502, the semiconductor dice 510, the wires 518, the lenses 520, and the light emitting assemblies 300. The encapsulating layer 528 may then be cured with UV light, heat, and/or moisture to cause the encapsulating layer 528 to take a solid form more quickly. Preferably, the temperature at which the molding compound forming the encapsulating layer 528 transitions from a solid form to a liquid or gel form is lower than the temperature at which the transparent material 220 forming the lenses 302 of the light emitting assemblies 300 transitions from a solid form to a liquid or gel form. Thus, the semiconductor assembly 500 may be at a temperature that enables the encapsulating layer 528 to be in a liquid or gel form while the transparent material 220 forming the lenses 302 of the light emitting assemblies 300 remains in a solid form.

Figure 5E:
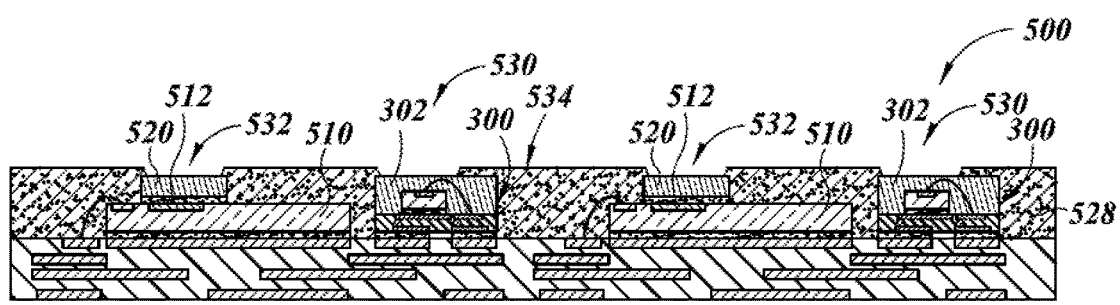

As shown in FIG. 5E, the masks 524 are then removed from the lenses 520 over the sensor areas 512 of the semiconductor dice 510, and the masks 526 are removed from the lenses 302 of the light emitting assemblies 300. When the masks 524 and the masks 526 are removed, first apertures 530 are formed over respective lenses 302 of the light emitting assemblies 300 and second apertures 532 are formed over respective lenses 520 over the sensor areas 512 of the semiconductor dice 510. In one embodiment, blades are used to scrape or otherwise remove portions of the encapsulating layer 528 from the upper surfaces of the lenses 302 of the light emitting assemblies 300 and the lenses 520 over the sensor areas 512 of the semiconductor dice 510 to form the first openings 530 and the second openings 532, respectively.

In one embodiment, the masks 524 and the masks 526 are projections that extend downwardly from an upper surface of a cavity included in conventional film-assisted molding machinery. The semiconductor assembly 500 is placed in the cavity and the machinery raises the semiconductor assembly 500 toward the upper surface of the cavity until the masks 524 and the masks 526 contact the upper surfaces of the lenses 302 of the light emitting assemblies 300 and the lenses 520 over the sensor areas 512 of the semiconductor dice 510, respectively. While the machinery holds the semiconductor assembly 500 in this position, the machinery injects the molding compound that forms the encapsulating layer 528 into the cavity. After the molding compound has at least partially cured or hardened, the machinery moves the semiconductor assembly 500 away from the upper surface of the cavity until the masks 524 and the masks 526 no longer contact the lenses 302 of the light emitting assemblies 300 and the lenses 520 over the sensor areas 512 of the semiconductor dice 510, respectively.

Figure 6A:
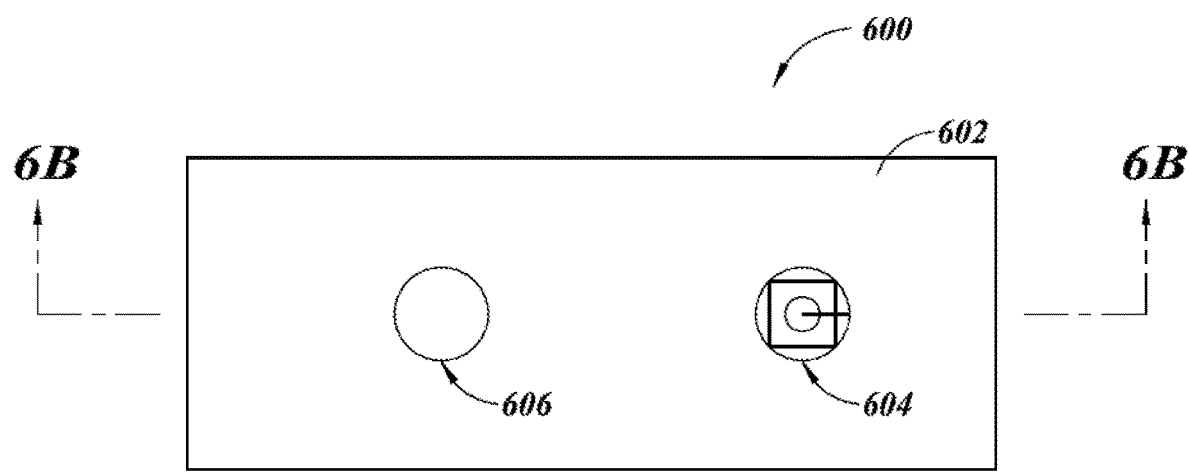
FIG. 6A is a top view of a proximity sensor, according to one embodiment.
Figure 6B:
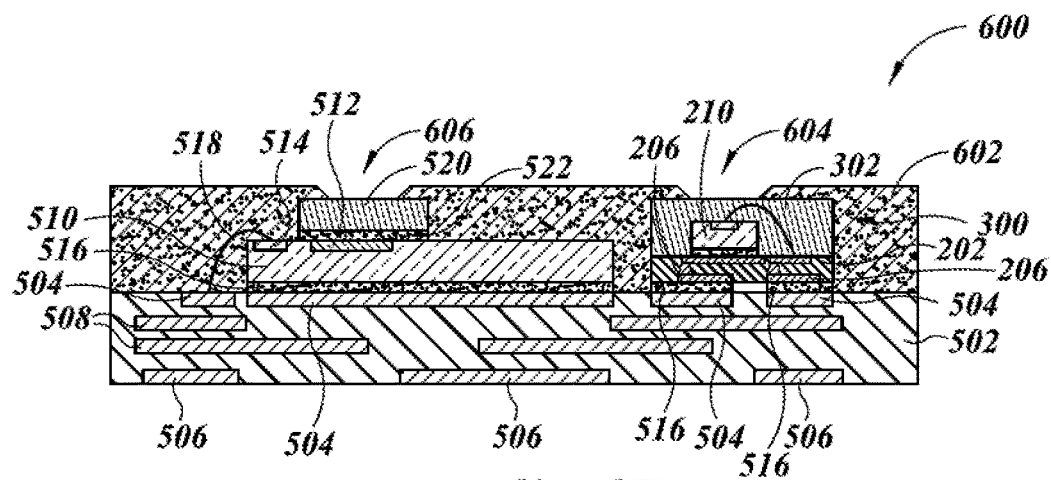
FIG. 6B is a cross-sectional view of the proximity sensor shown in FIG. 6A.

With reference to FIGS. 5E, 6A, and 6B, the semiconductor assembly 500 is then sawed or otherwise separated to form a plurality of proximity sensors 600. For example, the blade of a saw is placed on the upper surface of the encapsulating layer 528 at the location 534 in FIG. 5E and then moved downwardly until the blade passes through the encapsulating layer 528 and the printed circuit board substrate 502 to form a plurality of proximity sensors 600.

FIG. 6A is a top plan view of the proximity sensor 600. The proximity sensor 600 includes a cover 602 formed from the encapsulating layer 528. The cover 602 has a first aperture 604 and a second aperture 606 formed therein. The first aperture 604 is formed from one of the first apertures 530 and the second aperture 606 is formed from one of the second apertures 532.

FIG. 6B is a cross-sectional view of the proximity sensor 600 along the line 66-66 shown in FIG. 6A. The proximity sensor 600 includes the printed circuit board substrate 502. An upper surface of the printed circuit board substrate 502 includes the contact pads 504. A lower surface of the printed circuit board substrate 502 includes the contact pads 506. The conductive traces 508 form electrical connections between one or more of the contact pads 504 on the upper surface of the printed circuit board substrate 502 and one or more of the contact pads 506 on the lower surface of the printed circuit board substrate 502.

The semiconductor die 510 is disposed on the upper surface of the printed circuit board substrate 502. The upper surface of the semiconductor die 510 includes the sensor area 512 and the at least one contact pad 514. The conductive adhesive material 516 forms an electrical connection between a lower surface of the semiconductor die 510 and one of the contact pads 504 on the upper surface of the printed circuit board substrate 502. The conductive adhesive material 516 also forms an electrical connection between each of the contact pads 206 on the lower surface of the printed circuit board substrate 202 of the light emitting assembly 300 and a respective one of the contact pads 504 on the upper surface of the printed circuit board substrate 502.

At least one wire 518 forms an electrical connection between at least one of the contact pads 504 on the upper surface of the printed circuit board substrate 502 and the at least one contact pad 514 on the upper surface of the semiconductor die 510. The lens 520 disposed over the sensor area 512 of the semiconductor die 510. The transparent adhesive material 522 secures the lens 520 to the semiconductor die 510. The proximity sensor 600 also includes the light emitting assembly 300, which is described above.

Because the cover 602 is formed from an opaque material, the cover 602 prevents external light from reaching the sensor area 512 of the semiconductor die 510. Additionally, the cover 602 prevents light emitted from the light emitting device 210, which does not exit the proximity sensor 600 through the first aperture 604 and reenter the proximity sensor through the second aperture 606, from reaching the sensor area 512 of the semiconductor die 510.

During operation of the proximity sensor 600, electrical power is provided to the proximity sensor 600 through one or more of the contact pads 506 on the lower surface of the printed circuit board substrate 502. The electrical power may be supplied to the semiconductor die 510 via one or more of the conductive traces 508 connected to one of the contact pads 504 on the upper surface of the printed circuit board substrate 502 that is connected by at least one wire 518 to at least one contact pad 514 on the upper surface of the semiconductor die 510. A common reference potential (e.g., ground) may be provided to the proximity sensor 600 through one or more of the contact pads 506 on the lower surface of the printed circuit board substrate 502. The common reference potential may be supplied to the semiconductor die 510 via one or more of the conductive traces 508 connected to one of the contact pads 504 on the upper surface of the printed circuit board substrate 502 that is connected to the lower surface of the semiconductor die 510.

Additionally, the electrical power and the common reference potential may be supplied to the light emitting assembly 300 via two or more of the conductive traces 508 connected to two of the contact pads 504 on the upper surface of the printed circuit board substrate 502 that are connected to respective ones of the contact pads 206 on the lower surface of the printed circuit board substrate 202. The proximity sensor 600 may provide data or control signals from one or more of the contact pads 506 on the lower surface of the printed circuit board substrate 502. Those contact pads 506 are connected by one or more of the conductive traces 508 to one or more of the contact pads 504 on the upper surface of the printed circuit board substrate 502 that also are connected by one or more of the wires 518 to one or more of the contact pads 514 on the upper surface of the semiconductor die 510. Only one such contact pad 504, contact pad 514, and wire 518 is shown in FIG. 6B.

The light emitting device 210 emits light through the lens 302 and the first aperture 604 in the cover 602. Light that is reflected by an object in the vicinity of the proximity sensor 600 may enter the second aperture 606 in the cover 602, pass through the lens 520, and impact the sensor area 512 of the semiconductor die 510. The semiconductor die 510 outputs one or more signals that are indicative of or proportional to the magnitude of the intensity of the light incident on the sensor area 512, from one or more of the contact pads 514 on the upper surface of the semiconductor die 510. The semiconductor die 510 may include a driver that causes power to be supplied to the light emitting assembly 300 at predetermined times.

Figure 7A:
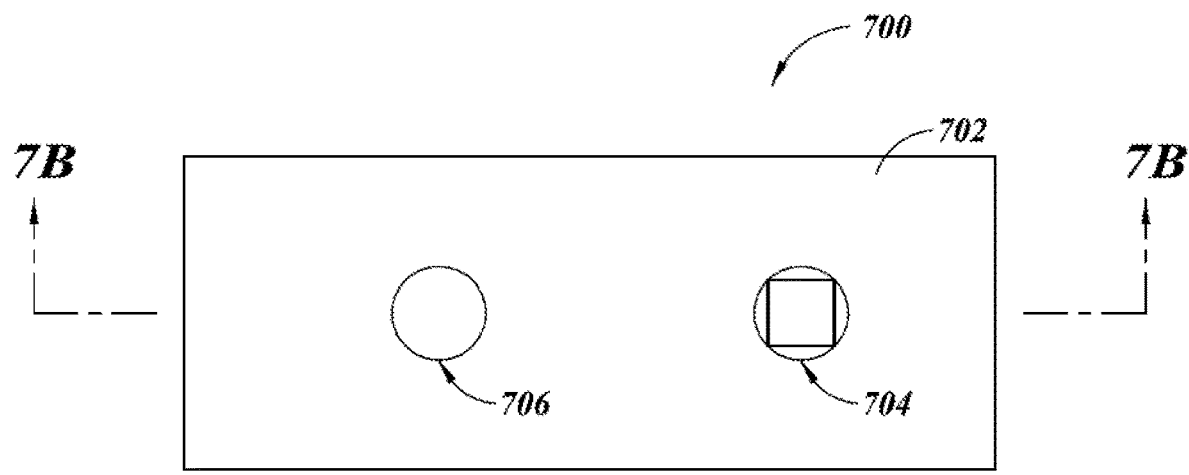
FIG. 7A is a top plan view of a proximity sensor, according to one embodiment.
Figure 7B:
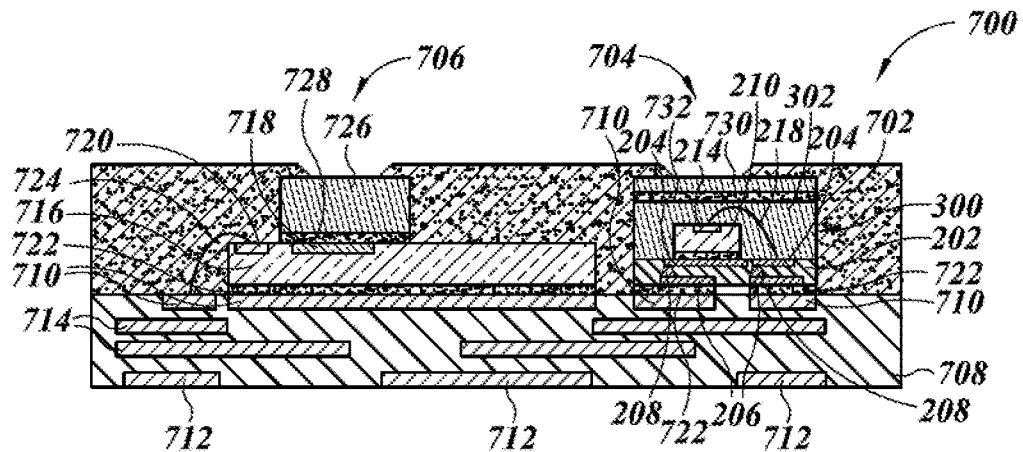
FIG. 7B is a cross-sectional view of the proximity sensor shown in FIG. 7A.

FIG. 7A is a top plan view of a proximity sensor 700, according to one embodiment. FIG. 7B is a cross-sectional view of the proximity sensor 700 along the line 7B-7B shown in FIG. 7A. The proximity sensor 700 is similar to the proximity sensor 600 shown in FIGS. 6A and 6B, except that the proximity sensor 700 includes an additional lens over the light emitting assembly, as explained in detail below.

The proximity sensor 700 includes a cover 702 having a first aperture 704 and a second aperture 706 formed therein. The proximity sensor 700 also includes a printed circuit board substrate 708. An upper surface of the printed circuit board substrate 708 includes a plurality of contact pads 710. A lower surface of the printed circuit board substrate 708 includes a plurality of contact pads 712. A plurality conductive traces 714 form electrical connections between one or more of the contact pads 710 on the upper surface of the printed circuit board substrate 708 and one or more of the contact pads 712 on the lower surface of the printed circuit board substrate 708.

A conventional semiconductor die 716 is disposed on the upper surface of the printed circuit board substrate 708. The semiconductor die 716 includes a sensor area 718 and at least one contact pad 720 on an upper surface of the semiconductor die 716. In one embodiment, the sensor area 718 is part of a photodiode that converts light into current, wherein the magnitude of the current is proportional to the magnitude of the intensity of the light.

A conventional conductive adhesive material 722 forms an electrical connection between a lower surface of the semiconductor die 716 and one of the contact pads 710 on the upper surface of the printed circuit board substrate 708. The conductive adhesive material 722 also forms an electrical connection between each of the contact pads 206 on the lower surface of the printed circuit board substrate 202 and a respective one of the contact pads 710 on the upper surface of the printed circuit board substrate 708.

At least one wire 724 forms at least one electrical connection between at least one of the contact pads 710 on the upper surface of the printed circuit board substrate 708 and the at least one contact pad 720 on the upper surface of the semiconductor die 716.

A conventional lens 726 is disposed over the sensor area 718 of the semiconductor die 716. A transparent adhesive material 728 secures the lens 726 to the semiconductor die 716. A lens 730 is disposed over the lens 302 of the light emitting assembly 300. A transparent adhesive material 732 secures the lens 730 to the lens 302 of the light emitting assembly 300.

The lens 726, the transparent adhesive material 728, the lens 730 and/or the transparent adhesive material 732 may enable most, if not all, of the light incident thereon to pass therethrough. For example, the lens 726, the transparent adhesive material 728, the lens 730 and/or the transparent adhesive material 732 may enable at least 85% of the light in the visible spectrum or light in the infrared spectrum that is incident thereon to pass therethrough. Additionally or alternatively, the lens 726, the transparent adhesive material 728, the lens 730 and/or the transparent adhesive material 732 may act as a filter that prevents predetermined wavelengths of light from passing therethrough. For example, the lens 726, the transparent adhesive material 728, the lens 730 and/or the transparent adhesive material 732 may prevent light in the visible spectrum or light in the infrared spectrum that is incident thereon from passing therethrough.

During fabrication of the proximity sensor 700, masks (not shown) are placed over at least part of the upper surfaces of the lens 726 and the lens 730. An encapsulation layer that forms the cover 702 is placed on the upper surface of the printed circuit board substrate 708 and at least part of the upper and side surfaces each of the semiconductor die 716, the wire 724, the lens 726, and the lens 730, and on the side surfaces of the light emitting assembly 300. The masks are then removed to form the first aperture 704 and the second aperture 706.

Figure 8A:
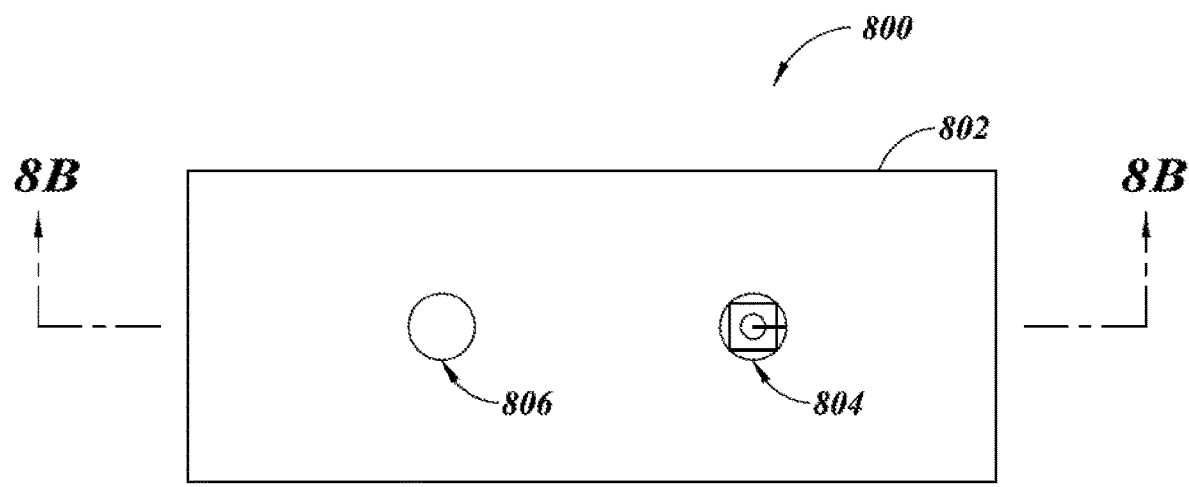
FIG. 8A is a top plan view of a proximity sensor, according to one embodiment.
Figure 8B:
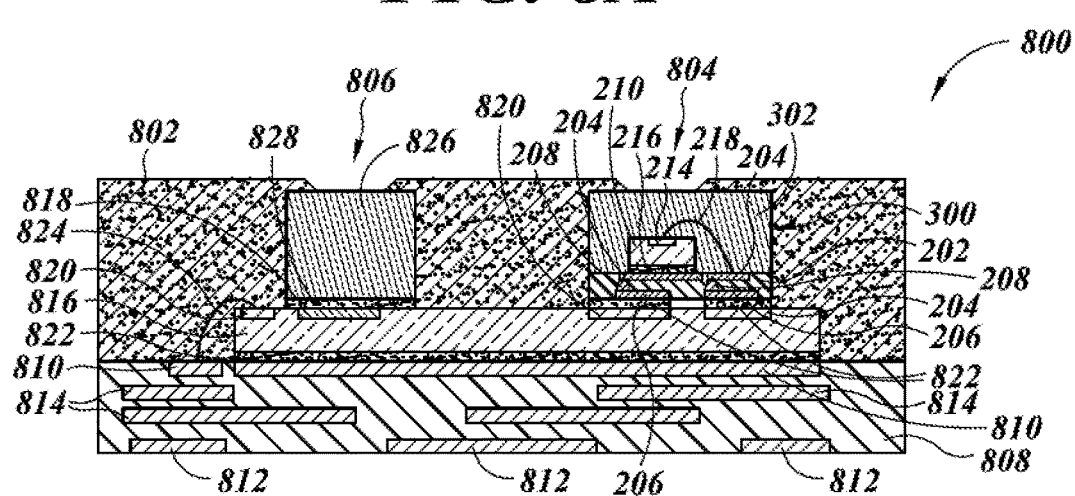
FIG. 8B is a cross-sectional view of the proximity sensor shown in FIG. 8A.

FIG. 8A is a top plan view of a proximity sensor 800, according to one embodiment. FIG. 8B is a cross-sectional view of the proximity sensor 800 take along the line 8B-8B shown in FIG. 8A. The proximity sensor 800 is similar to the proximity sensor 600 shown in FIGS. 6A and 6B, except that the light emitting assembly is mounted on the semiconductor die, as explained in detail below.

The proximity sensor 800 includes a cover 802 having a first aperture 804 and a second aperture 806 formed therein. The proximity sensor 800 also includes a printed circuit board substrate 808. An upper surface of the printed circuit board substrate 808 includes a plurality of contact pads 810. A lower surface of the printed circuit board substrate 808 includes a plurality of contact pads 812. A plurality conductive traces 814 form electrical connections between one or more of the contact pads 810 on the upper surface of the printed circuit board substrate 808 and one or more of the contact pads 812 on the lower surface of the printed circuit board substrate 808.

A conventional semiconductor die 816 is disposed on the upper surface of the printed circuit board substrate 808. The semiconductor die 816 includes a sensor area 818 and a plurality of contact pads 820 on an upper surface of the semiconductor die 816. In one embodiment, the sensor area 818 is part of a photodiode that converts light into current, wherein the magnitude of the current is proportional to the magnitude of the intensity of the light.

A conventional conductive adhesive material 822 forms an electrical connection between a lower surface of the semiconductor die 816 and one of the contact pads 810 on the upper surface of the printed circuit board substrate 808. At least one wire 824 forms an electrical connection between at least one of the contact pads 810 on the upper surface of the printed circuit board substrate 808 and at least one of the contact pads 820 on the upper surface of the semiconductor die 816.

A conventional lens 826 is disposed over the sensor area 818 of the semiconductor die 816. A conventional transparent adhesive material 828 secures the lens 826 to the semiconductor die 816. The lenses 826 and/or the transparent adhesive material 828 may enable most, if not all, of the light incident thereon to pass therethrough. For example, the lenses 826 and/or the transparent adhesive material 828 may enable at least 85% of the light in the visible spectrum or light in the infrared spectrum that is incident thereon to pass therethrough. Additionally or alternatively, the lenses 826 and/or the transparent adhesive material 828 may act as a filter that prevents predetermined wavelengths of light from passing therethrough. For example, the lenses 826 and/or the transparent adhesive material 828 may prevent light in the visible spectrum or light in the infrared spectrum that is incident thereon from passing therethrough.

The proximity sensor 800 also includes the light emitting assembly 300, which is described above. The conductive adhesive material 822 forms an electrical connection between each of the contact pads 206 on the lower surface of the printed circuit board substrate 202 and a respective one of the contact pads 820 on the upper surface of the semiconductor die 816. During fabrication of the proximity sensor 800, masks (not shown) are placed over at least part of the upper surfaces of the lens 826 and the lens 302. An encapsulation layer that forms the cover 802 is placed on the upper surface of the printed circuit board substrate 808 and at least part of the upper and side surfaces each of the semiconductor die 816, the wire 824, the lens 826, and the light emitting assembly 300. The masks are then removed to form the first aperture 804 and the second aperture 806.

Figure 9A:
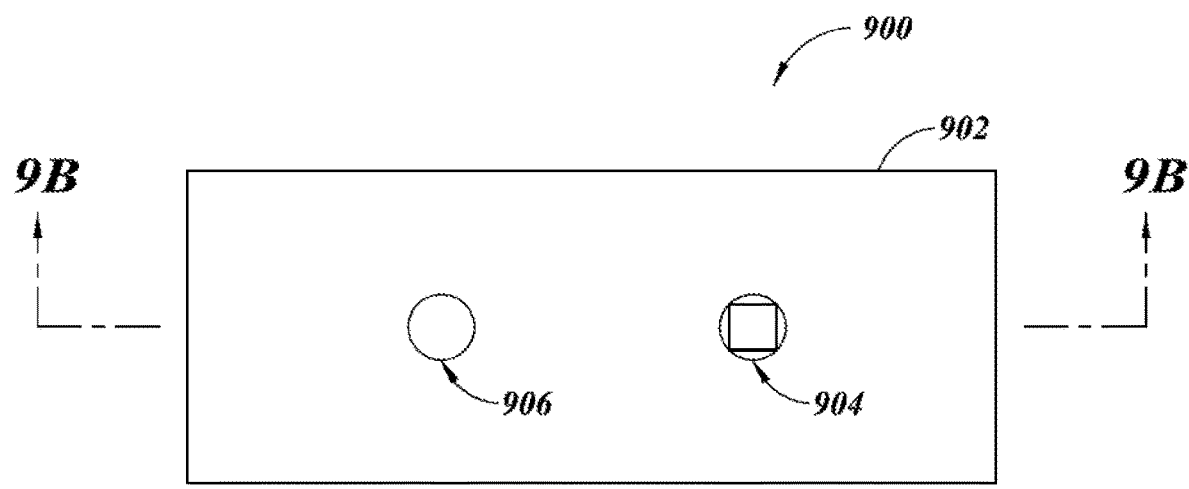
FIG. 9A is a top plan view of a proximity sensor, according to one embodiment.
Figure 9B:
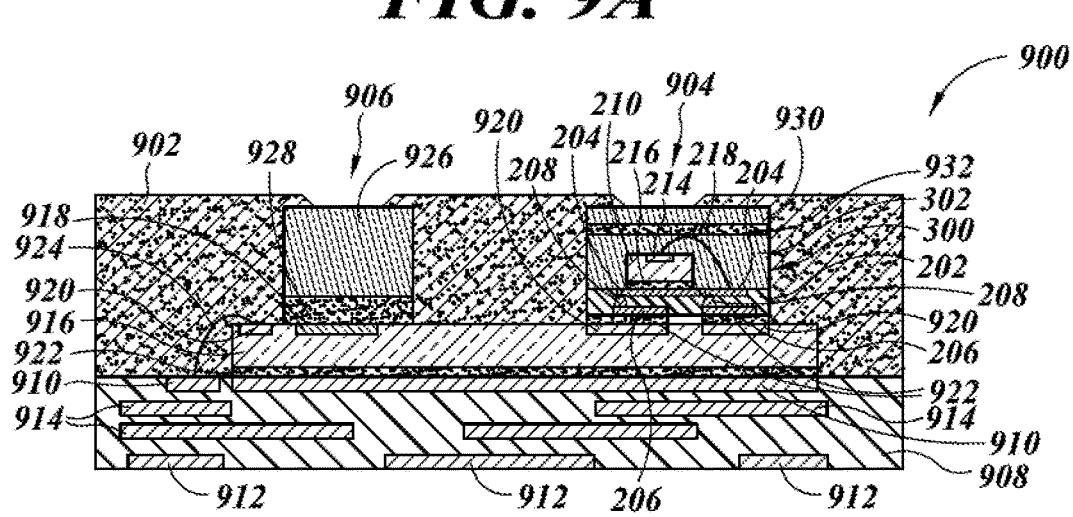
FIG. 9B is a cross-sectional view of the proximity sensor shown in FIG. 9A.

FIG. 9A is a top plan view of a proximity sensor 900, according to one embodiment. FIG. 9B is a cross-sectional view of the proximity sensor 900 take along the line 9B-9B shown in FIG. 9A. The proximity sensor 900 is similar to the proximity sensor 800 shown in FIGS. 8A and 8B, except that an additional lens is mounted on the light emitting assembly, as explained in detail below.

The proximity sensor 900 includes a cover 902 having a first aperture 904 and a second aperture 906 formed therein. The proximity sensor 900 also includes a printed circuit board substrate 908. An upper surface of the printed circuit board substrate 908 includes a plurality of contact pads 910. A lower surface of the printed circuit board substrate 908 includes a plurality of contact pads 912. A plurality conductive traces 914 forms electrical connections between one or more of the contact pads 910 on the upper surface of the printed circuit board substrate 908 and one or more of the contact pads 912 on the lower surface of the printed circuit board substrate 908.

A conventional semiconductor die 916 is disposed on the upper surface of the printed circuit board substrate 908. The semiconductor die 916 includes a sensor area 918 and a plurality of contact pads 920 on an upper surface of the semiconductor die 916. In one embodiment, the sensor area 918 is part of a photodiode that converts light into current, wherein the magnitude of the current is proportional to the magnitude of the intensity of the light.

A conventional conductive adhesive material 922 forms an electrical connection between a lower surface of the semiconductor die 916 and one of the contact pads 910 on the upper surface of the printed circuit board substrate 908. At least one wire 924 forms an electrical connection between at least one of the contact pads 910 on the upper surface of the printed circuit board substrate 908 and at least one the contact pads 920 on the upper surface of the semiconductor die 916.

A conventional lens 926 is disposed over the sensor area 918 of the semiconductor die 916. A conventional transparent adhesive material 928 secures the lens 926 to the semiconductor die 916. The proximity sensor 900 also includes the light emitting assembly 300, which is described above. The conductive adhesive material 922 forms an electrical connection between each of the contact pads 206 on the lower surface of the printed circuit board substrate 202 and a respective one of the contact pads 920 on the upper surface of the semiconductor die 916. A lens 930 is disposed over the lens 302 of the light emitting assembly 300. A transparent adhesive material 932 secures the lens 930 to the lens 302 of the light emitting assembly 300.

The lens 926, the transparent adhesive material 928, the lens 930 and/or the transparent adhesive material 932 may enable most, if not all, of the light incident thereon to pass therethrough. For example, the lens 926, the transparent adhesive material 928, the lens 930 and/or the transparent adhesive material 932 may enable at least 85% of the light in the visible spectrum or light in the infrared spectrum that is incident thereon to pass therethrough. Additionally or alternatively, the lens 926, the transparent adhesive material 928, the lens 930 and/or the transparent adhesive material 932 may act as a filter that prevents predetermined wavelengths of light from passing therethrough. For example, the lens 926, the transparent adhesive material 928, the lens 930 and/or the transparent adhesive material 932 may prevent light in the visible spectrum or light in the infrared spectrum that is incident thereon from passing therethrough.

During fabrication of the proximity sensor 900, masks (not shown) are placed over at least part of the upper surfaces of the lens 926 and the lens 930. An encapsulation layer that forms the cover 902 is placed on the upper surface of the printed circuit board substrate 908 and at least part of the upper and side surfaces each of the semiconductor die 916, the wire 924, the lens 926, and the lens 930, and side surfaces of the light emitting assembly 300. The masks are then removed to form the first aperture 904 and the second aperture 906.

Figure 10A:
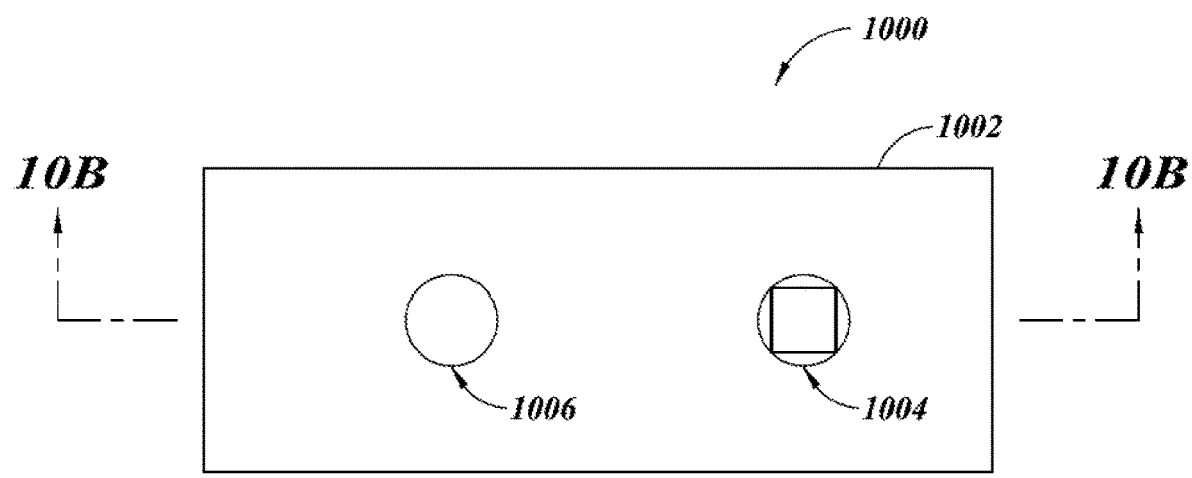
FIG. 10A is a top plan view of a proximity sensor, according to one embodiment.
Figure 10B:
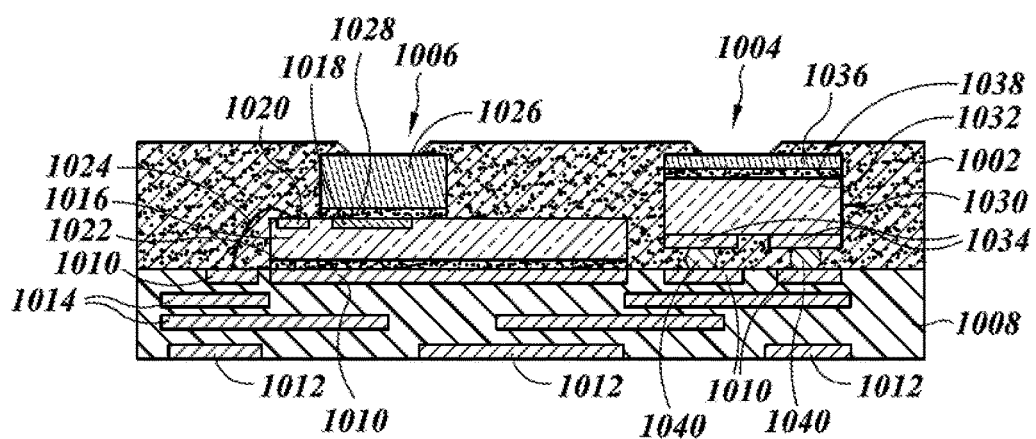
FIG. 10B is a cross-sectional view of the proximity sensor shown in FIG. 10A.

FIG. 10A is a top plan view of a proximity sensor 1000, according to one embodiment. FIG. 10B is a cross-sectional view of the proximity sensor 1000 along the line 10B-10B shown in FIG. 10A. The proximity sensor 1000 is similar to the proximity sensor 600 shown in FIGS. 6A and 6B, except that the light emitting assembly does not include a printed circuit board substrate and the light emitting device includes a plurality of contact pads on a lower surface thereof, as explained in detail below.

The proximity sensor 1000 includes a cover 1002 having a first aperture 1004 and a second aperture 1006 formed therein. The proximity sensor 1000 also includes a printed circuit board substrate 1008. An upper surface of the printed circuit board substrate 1008 includes a plurality of contact pads 1010. A lower surface of the printed circuit board substrate 1008 includes a plurality of contact pads 1012. A plurality conductive traces 1014 form electrical connections between one or more of the contact pads 1010 on the upper surface of the printed circuit board substrate 1008 and one or more of the contact pads 1012 on the lower surface of the printed circuit board substrate 1008.

A conventional semiconductor die 1016 is disposed on the upper surface of the printed circuit board substrate 1008. The semiconductor die 1016 includes a sensor area 1018 and at least one contact pad 1020 on an upper surface of the semiconductor die 1016. In one embodiment, the sensor area 1018 is part of a photodiode that converts light into current, wherein the magnitude of the current is proportional to the magnitude of the intensity of the light.

A conventional conductive adhesive material 1022 forms an electrical connection between a lower surface of the semiconductor die 1016 and one of the contact pads 1010 on the upper surface of the printed circuit board substrate 1008. At least one wire 1024 forms an electrical connection between at least one of the contact pads 1010 on the upper surface of the printed circuit board substrate 1008 and the at least one contact pads 1020 on the upper surface of the semiconductor die 1016.

A conventional lens 1026 is disposed over the sensor area 1018 of the semiconductor die 1016. A conventional transparent adhesive material 1028 secures the lens 1026 to the semiconductor die 1016. The proximity sensor 1000 also includes a light emitting assembly 1030. The light emitting assembly 1030 includes a conventional light emitting device 1032. In one embodiment, the light emitting device 1032 is a conventional light emitting diode (LED). In one embodiment, the light emitting device 1032 is a conventional vertical-cavity surface-emitting laser (VCSEL).

A lower surface of the light emitting device 1032 includes a plurality of contact pads 1034. A conventional lens 1036 is disposed over a light emitting area of the light emitting device 1032. A conventional transparent adhesive material 1038 secures the lens 1036 to the light emitting device 1032.

The conventional lens 1026, the transparent adhesive material 1028, the lens 1036, and/or the transparent adhesive material 1038 may enable most, if not all, of the light incident thereon to pass therethrough. For example, the lens 1026, the transparent adhesive material 1028, the lens 1036 and/or the transparent adhesive material 1038 may enable at least 85% of the light in the visible spectrum or light in the infrared spectrum that is incident thereon to pass therethrough. Additionally or alternatively, the lens 1026, the transparent adhesive material 1028, the lens 1036, and/or the transparent adhesive material 1038 may act as a filter that prevents predetermined wavelengths of light from passing therethrough. For example, the lens 1026, the transparent adhesive material 1028, the lens 1036, and/or the transparent adhesive material 1038 may prevent light in the visible spectrum or light in the infrared spectrum that is incident thereon from passing therethrough.

A plurality of solder bumps 1040 form electrical connections between the contact pads 1034 and respective ones of the contact pads 1010 formed on the upper surface of the printed circuit board substrate 1008. For example, during fabrication of the proximity sensor 1000, the solder bumps 1040 are formed on the contact pads 1034 that are on the lower surface of light emitting device 1032. The light emitting assembly 1030 is then placed over the upper surface of the printed circuit board substrate 1008, the solder bumps 1040 are aligned with corresponding contact pads 1010 on the upper surface of the printed circuit board substrate 1008, and the solder bumps 1040 are placed onto the corresponding contact pads 1010 on the upper surface of the printed circuit board substrate 1008. The resulting assembly is then heated and the solder bumps 1040 form electrical connections between the contact pads 1034 on the lower surface of light emitting device 1032 and respective one of the contact pads 1010 on the upper surface of the printed circuit board substrate 1008.

Subsequently, masks (not shown) are placed over at least part of the upper surfaces of the lens 1026 and the lens 1036. An encapsulation layer that forms the cover 1002 is placed on the upper surface of the printed circuit board substrate 1008 and at least part of the upper and side surfaces each of the semiconductor die 1016, the wire 1024, the lens 1026, and the lens 1036, and on the side surfaces of the light emitting assembly 1030. The masks are then removed to form the first aperture 1004 and the second aperture 1006.

Figure 11A:
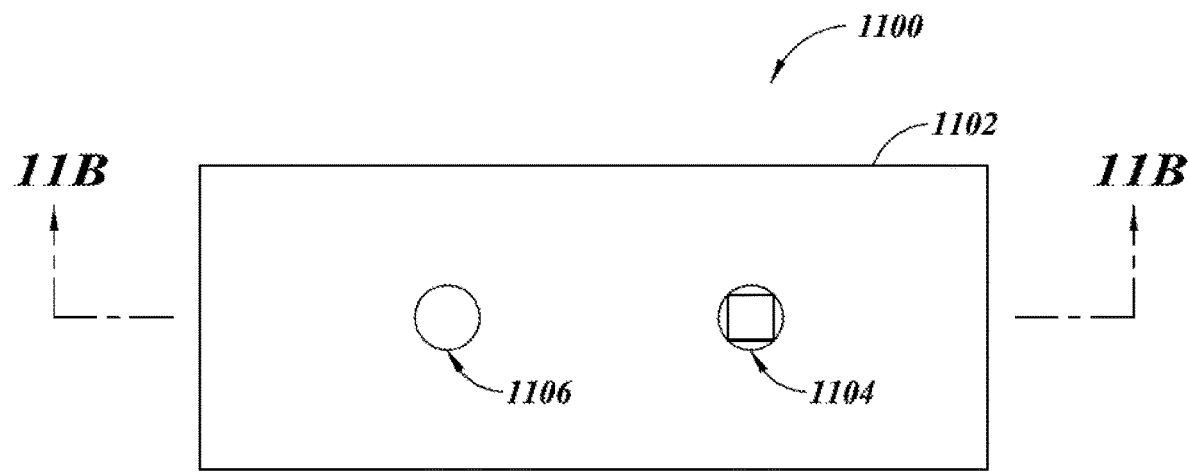
FIG. 11A is a top plan view of a proximity sensor, according to one embodiment.
Figure 11B:
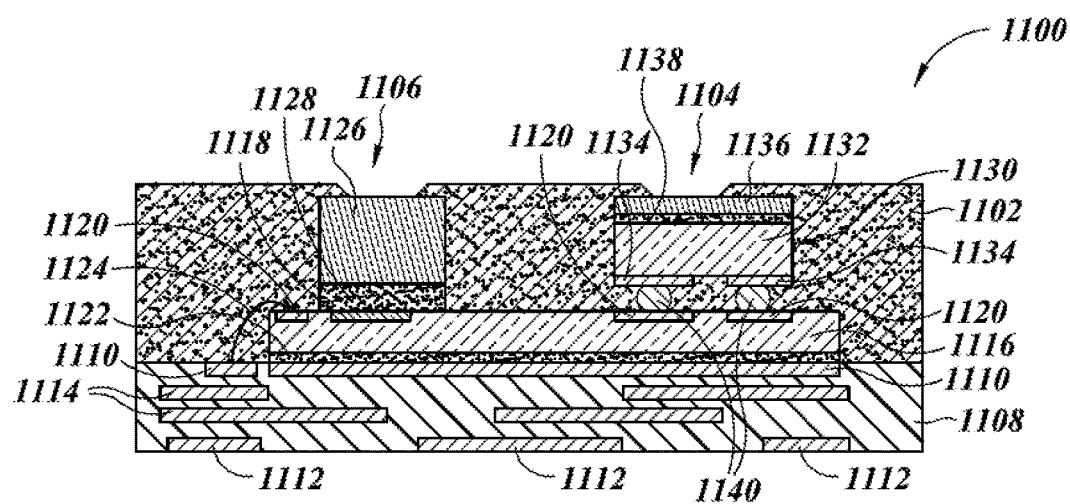
FIG. 11B is a cross-sectional view of the proximity sensor shown in FIG. 11A.

FIG. 11A is a top plan view of a proximity sensor 1100, according to one embodiment. FIG. 11B is a cross-sectional view of the proximity sensor 1100 take along the line 11B-11B shown in FIG. 11A. The proximity sensor 1100 is similar to the proximity sensor 1000 shown in FIGS. 10A and 10B, except that the light emitting assembly is mounted on the semiconductor die, as explained in detail below.

The proximity sensor 1100 includes a cover 1102 having a first aperture 1104 and a second aperture 1106 formed therein. The proximity sensor 1100 also includes a printed circuit board substrate 1108. An upper surface of the printed circuit board substrate 1108 includes a plurality of contact pads 1110. A lower surface of the printed circuit board substrate 1108 includes a plurality of contact pads 1112. A plurality conductive traces 1114 form electrical connections between one or more of the contact pads 1110 on the upper surface of the printed circuit board substrate 1108 and one or more of the contact pads 1112 on the lower surface of the printed circuit board substrate 1108.

A conventional semiconductor die 1116 is disposed on the upper surface of the printed circuit board substrate 1108. The semiconductor die 1116 includes a sensor area 1118 and a plurality of contact pads 1120 on an upper surface of the semiconductor die 1116. In one embodiment, the sensor area 1118 is part of a photodiode that converts light into current, wherein the magnitude of the current is proportional to the magnitude of the intensity of the light.

A conductive adhesive material 1122 forms an electrical connection between a lower surface of the semiconductor die 1116 and one of the contact pads 1110 on the upper surface of the printed circuit board substrate 1108. At least one wire 1124 forms an electrical connection between at least one of the contact pads 1110 on the upper surface of the printed circuit board substrate 1108 and at least one the contact pads 1120 on the upper surface of the semiconductor die 1116.

A conventional lens 1126 is disposed over the sensor area 1118 of the semiconductor die 1116. A conventional transparent adhesive material 1128 secures the lens 1126 to the semiconductor die 1116. The proximity sensor 1100 also includes a light emitting assembly 1130. The light emitting assembly 1130 includes a conventional light emitting device 1132. In one embodiment, the light emitting device 1132 is a conventional light emitting diode (LED). In one embodiment, the light emitting device 1132 is a conventional vertical-cavity surface-emitting laser (VCSEL).

A lower surface of the light emitting device 1132 includes a plurality of contact pads 1134. A conventional lens 1136 is disposed over a light emitting area of the light emitting device 1132. A conventional transparent adhesive material 1138 secures the lens 1136 to the light emitting device 1132.

The lens 1126, the transparent adhesive material 1128, the lens 1136, and/or the transparent adhesive material 1138 may enable most, if not all, of the light incident thereon to pass therethrough. For example, the lens 1126, the transparent adhesive material 1128, the lens 1136, and/or the transparent adhesive material 1138 may enable at least 85% of the light in the visible spectrum or light in the infrared spectrum that is incident thereon to pass therethrough. Additionally or alternatively, the lens 1126, the transparent adhesive material 1128, the lens 1136, and/or the transparent adhesive material 1138 may act as a filter that prevents predetermined wavelengths of light from passing therethrough. For example, the lens 1126, the transparent adhesive material 1128, the lens 1136, and/or the transparent adhesive material 1138 may prevent light in the visible spectrum or light in the infrared spectrum that is incident thereon from passing therethrough.

A plurality of solder bumps 1140 form electrical connections with respective ones of the contact pads 1120 on the upper surface of the semiconductor die 1116. For example, during fabrication of the proximity sensor 1100, the solder bumps 1140 are formed on the contact pads 1134 that are on the lower surface of light emitting device 1132. The light emitting assembly 1130 is then placed over the upper surface of the semiconductor die 1116, the solder bumps 1140 are aligned with corresponding contact pads 1120 on the upper surface of the semiconductor die 1116, and the solder bumps 1140 are placed onto the corresponding contact pads 1120 on the upper surface of semiconductor die 1116. The resulting assembly is then heated and the solder bumps 1140 form electrical connections between the contact pads 1134 on the lower surface of light emitting device 1132 and respective ones of the contact pads 1120 on the upper surface of the semiconductor die 1116.

Subsequently, masks (not shown) are placed over at least part of the upper surfaces of the lens 1126 and the lens 1136. An encapsulation layer that forms the cover 1102 is placed on the upper surface of the printed circuit board substrate 1108 and at least part of the upper and side surfaces each of the semiconductor die 1116, the wire 1124, the lens 1126, and the lens 1136, and on the side surfaces of the light emitting assembly 1130. The masks are then removed to form the first aperture 1104 and the second aperture 1106.

FIGS. 12A-12H show a proximity sensor cap assembly 1200 at various stages of fabrication, according to one embodiment.

Figure 12A:
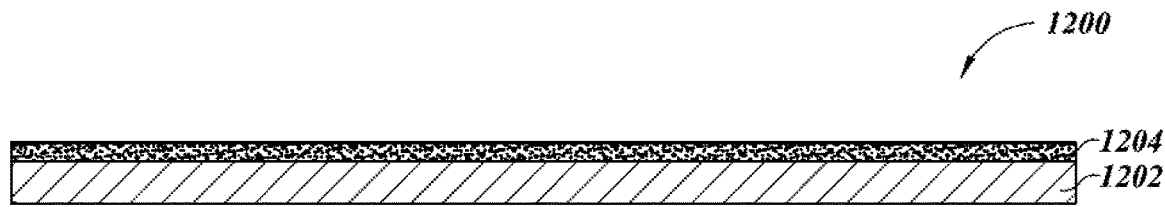
FIGS. 12A-12H show a proximity cap assembly at various stages of fabrication, according to one embodiment.

As shown in FIG. 12A, a carrier 1202 is provided. An adhesion layer 1204 is formed over an upper surface of the carrier 1202. For example, the carrier 1202 can be a silicon or a glass substrate or a metal sheet, and the adhesion layer 1204 is formed from a conventional adhesive material.

Figure 12B:
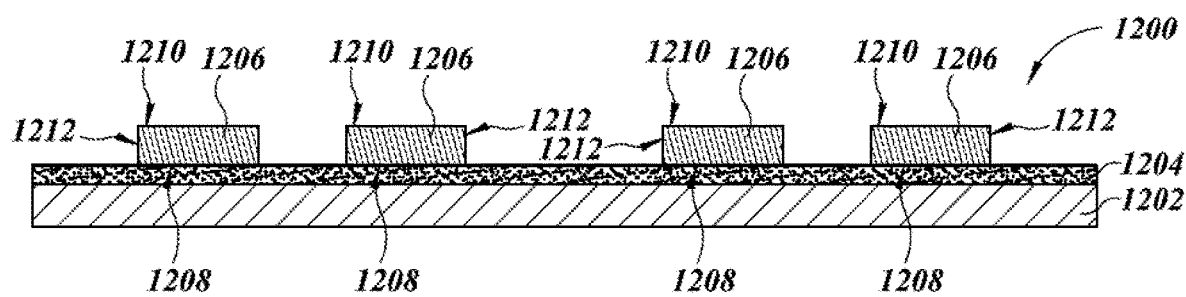

As shown in FIG. 12B, a plurality of conventional lenses 1206 is placed on the adhesion layer 1204. For example, pick-and-place machinery employing conventional surface mount technology may be used to place the lenses 1206 on the adhesion layer 1204. The lenses 1206 may be formed from glass or plastic, for example. The lenses 1206 may enable most, if not all, of the light incident thereon to pass therethrough. For example, the lenses 1206 may enable at least 85% of the light in the visible spectrum (e.g., wavelengths of light from approximately 1400 nanometers to 700 nanometers) or light in the infrared spectrum (e.g., wavelengths of light from approximately 700 nanometers to 1250 nanometers) that is incident thereon to pass therethrough. Additionally or alternatively, the lenses 1206 may act as a filter that prevents predetermined wavelengths of light from passing therethrough. For example, the lenses 1206 may prevent light in the visible spectrum or light in the infrared spectrum that is incident thereon from passing therethrough.

Each of the lenses 1206 includes a first side 1208, a second side 1210, and at least one third side 1212. The first side 1208 of each of the lenses 1206 faces the adhesion layer 1204. The second side 1210 of each of the lenses 1206 faces away from the adhesion layer 1204. Each third side 1212 is disposed between the first side 1208 and the second side 1210 of one of the lenses 1206. A plurality of surfaces respectively corresponds to the first side 1208, the second side 1210, and the third side 1212 of each of the lenses 1206.

Figure 12C:
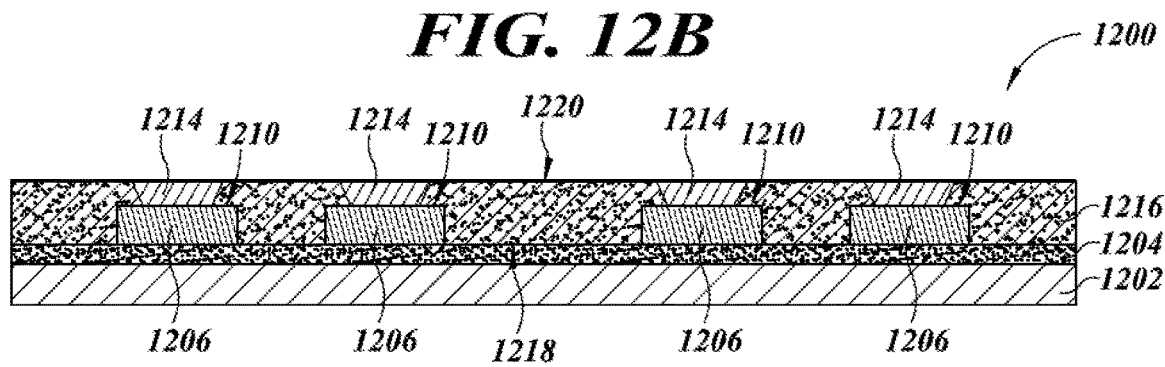

As shown in FIG. 12C, in one embodiment a plurality of masks 1214 is placed over the carrier 1202. Each mask 1214 is placed on the second side 1210 of one of the lenses 1206. For example, pick-and-place machinery employing conventional surface mount technology may be used to place the masks 1214 on the lenses 1206. An adhesive material (not shown) may be used to secure the masks 1214 to the lenses 1206. An encapsulating layer 1216 is then formed on exposed portions of the adhesion layer 1204, the third sides 1212 of the lenses 1206, and exposed portions of the second sides 1210 of the lenses 1206 that are not covered by the masks 1214. The encapsulating layer 1216 includes a first side 1218 that is in contact with the adhesion layer 1204 and a second side 1220 that faces away from the adhesion layer 1204 and is contact with the second side 1210 of each of the lenses 1206. Each of the first side 1218 and the second side 1220 of the encapsulating layer 1216 corresponds to at least one surface.

Figure 12D:
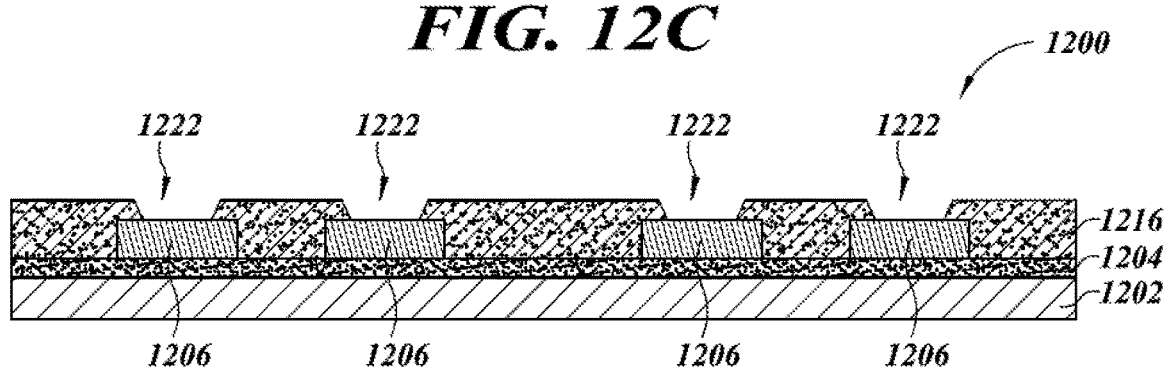

The masks 1214 shown in FIG. 12C are optional. In another embodiment, the masks 1214 shown in FIG. 12C are not used. A mold cavity is used instead. The areas shown covered by the masks 1214 are left open and the proximity sensor cap assembly 1200 is placed in the mold cavity. The mold cavity is shaped such that the encapsulating layer 1216 is formed as shown in FIG. 12D when the mold cavity is filled with a molding compound. Because steps to apply and remove the masks 1214 are not required when the cavity mold is used, use of the mold cavity can reduce the number of process steps.

The encapsulating layer is formed from a liquid that is placed onto the set of lenses. It can be a polymer, an epoxy, or other packaging material. It can be injected in a mold, spun on, flowed on, or otherwise applied in liquid form, after which it is cured. Since it is applied in liquid form around the lenses and then cured to be hardened, it will strongly adhere to the lens and be assured of blocking all light in areas around the lens. Layer 1216 is formed of a light blocking, highly opaque material.

As shown in FIG. 12D, a plurality of apertures 1222 is formed in the second side 1220 of encapsulating layer 1216 when the masks 1214 are removed from the lenses 1206. Each of the apertures 1222 is positioned over one of the lenses 1206.

Next, the encapsulating layer 1216 and the lenses 1206 are separated from the adhesion layer 1204. For example, a lower portion of the proximity sensor cap assembly 1200 that includes the adhesion layer 1204 is placed in a solvent such as water to separate the encapsulating layer 1216 and the lenses 1206 from the adhesion layer 1204.

In one embodiment, the masks 1214 are projections that extend downwardly from an upper surface of a cavity included in film-assisted molding machinery. The proximity sensor cap assembly 1200 is then placed in the cavity and raised toward the upper surface of the cavity until the masks 1214 contact the surfaces 1210 of the lenses 1206. While the machinery holds the proximity sensor cap assembly 1200 in this position, the machinery injects the molding compound that forms the encapsulating layer 1216 into the cavity. After the molding compound has at least partially hardened, the machinery moves the proximity sensor cap assembly 1200 away from the upper surface of the cavity until the masks 1214 no longer contact the lenses 1206.

Figure 12E:
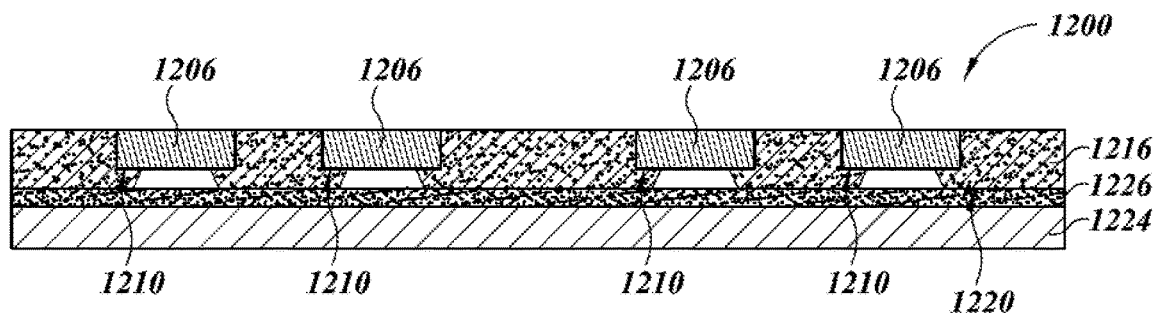

As shown in FIG. 12E, the encapsulating layer 1216 and the lenses 1206 are then flipped over and placed over a carrier 1224 having an adhesion layer 1226 formed thereon. For example, the carrier 1224 is a silicon glass or other carrier and the adhesion layer 1226 is formed from a conventional adhesive material. The second side 1220 of the encapsulating layer 1216 is then placed on the adhesion layer 1226. For example, pick-and-place machinery employing conventional surface mount technology may be used to place the encapsulating layer 1216 on the adhesion layer 1228.

Figure 12F:
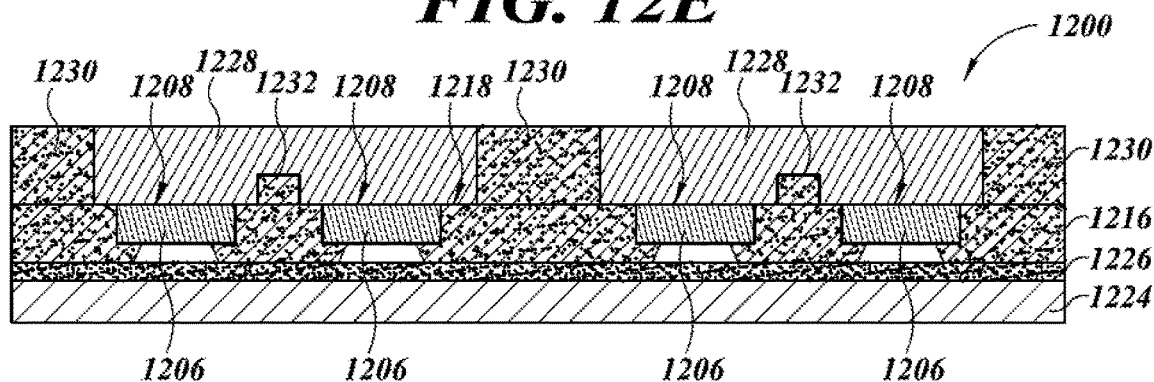

As shown in FIG. 12F, in one embodiment a plurality of masks 1228 is placed on the first side 1208 of each of the lenses 1206 and portions of the first side 1218 of the encapsulating layer 1216. For example, pick-and-place machinery employing conventional surface mount technology may be used to place the masks 1228 on the lenses 1206 and the encapsulating layer 1216. An adhesive material (not shown) may be used to secure the masks 1228 to the lenses 1206 and the encapsulating layer 1216.

A molding compound is then formed on exposed portions of the encapsulating layer 1216 that are not covered by the masks 1228. The molding compound forms a first plurality of feet 1230, a second plurality of feet 1232, and a third plurality of feet 1234 (shown in FIGS. 12G and 12H). As explained below, a pair of the feet 1230 and a pair of the feet 1234 form outer walls of a proximity sensor cap, and one of the feet 1232 forms a light barrier within the proximity sensor cap. The molding compound that forms the feet 1230, the feet 1232, and the feet 1234 is a conventional molding compound that does not transmit light therethrough. For example, the molding compound may be formed from a black material. The same molding compound may be used to form the encapsulating layer 1216, the feet 1230, the feet 1232, and the feet 1234.

Figure 12G:
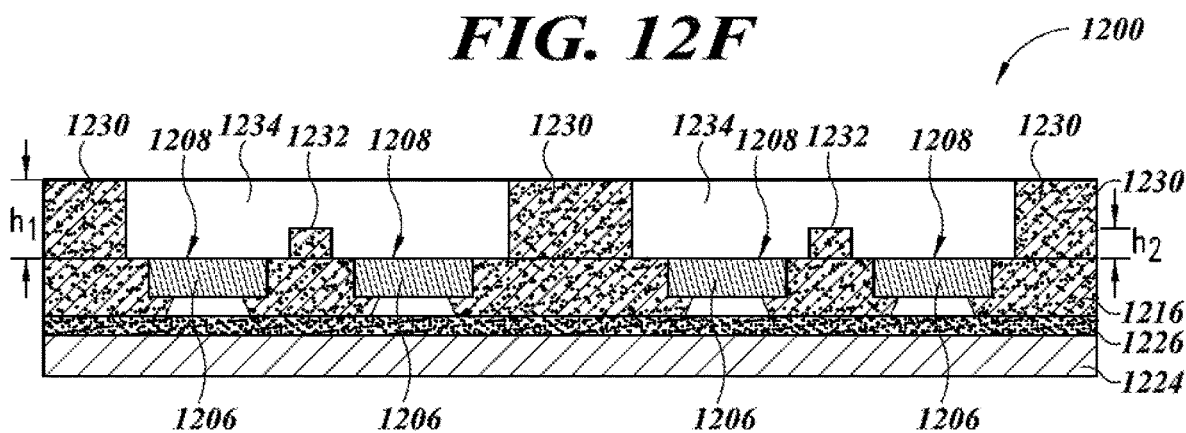

As shown in FIG. 12G, the masks 1228 are then removed from the first side 1208 of each of the lenses 1206 and the portions of the first side 1218 of the encapsulating layer 1216. Each of the feet 1230 and the feet 1234 has a height of $h_1$ and each of the feet 1232 has a height of $h_2$, wherein $h_1$ is greater than $h_2$.

The masks 1228 shown in FIG. 12F are optional. In another embodiment, the masks 1228 shown in FIG. 12F are not used. A mold cavity is used instead. The areas shown covered by the masks 1228 are left open and the proximity sensor cap assembly 1200 is placed in the mold cavity. The mold cavity is shaped such that the feet 1230, the feet 1232, and the feet 1234 are formed as shown in FIG. 12G when the mold cavity is filled with a molding compound. Because steps to apply and remove the masks 1228 are not required when the cavity mold is used, use of the mold cavity can reduce the number of process steps.

In one embodiment, the masks 1228 are projections that extend downwardly from an upper surface of a cavity included in film-assisted molding machinery. The proximity sensor cap assembly 1200 is then placed in the cavity and raised toward the upper surface of the cavity until the masks 1228 contact the surfaces 1208 of the lenses 1206 and portions of the first side 1218 of the encapsulating layer 1216. While the machinery holds the proximity sensor cap assembly 1200 in this position, the machinery injects the molding compound that forms the feet 1230, the feet 1232, and the feet 1234 into the cavity. After the molding compound has at least partially hardened, the machinery moves the proximity sensor cap assembly 1200 away from the upper surface of the cavity until the masks 1228 no longer contact the lenses 1206 and the encapsulating layer 1216.

Figure 12H:
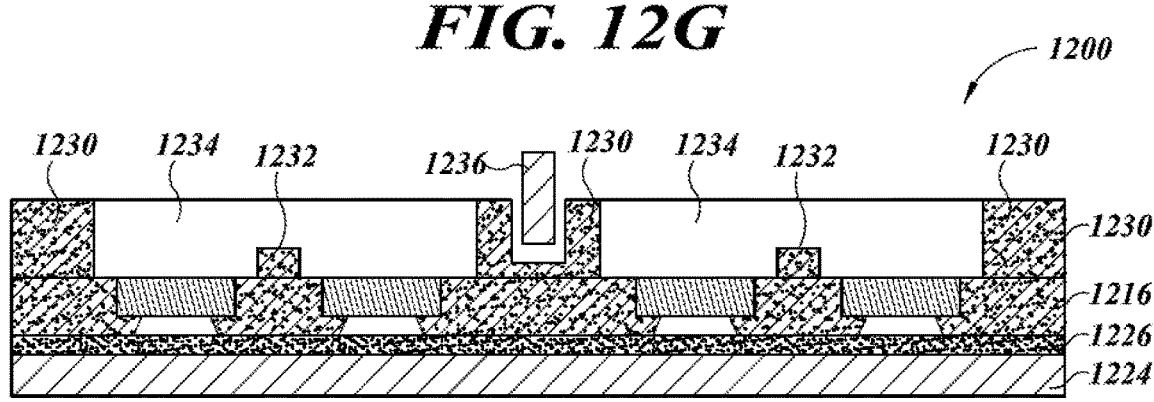

As shown in FIG. 12H, a blade 1236 of a saw (not shown) cuts or saws at least one cap foot 1230 in a lengthwise direction of the at least one cap foot 1230. The blade 1236 moves downwardly and passes through the at least one cap foot 1230 and the encapsulating layer 1216 under the at least one cap foot 1230. In practice, feet 1230 and 1234 will be a common wall that forms the outer wall of the proximity sensor cap 1300.

Figure 13A:
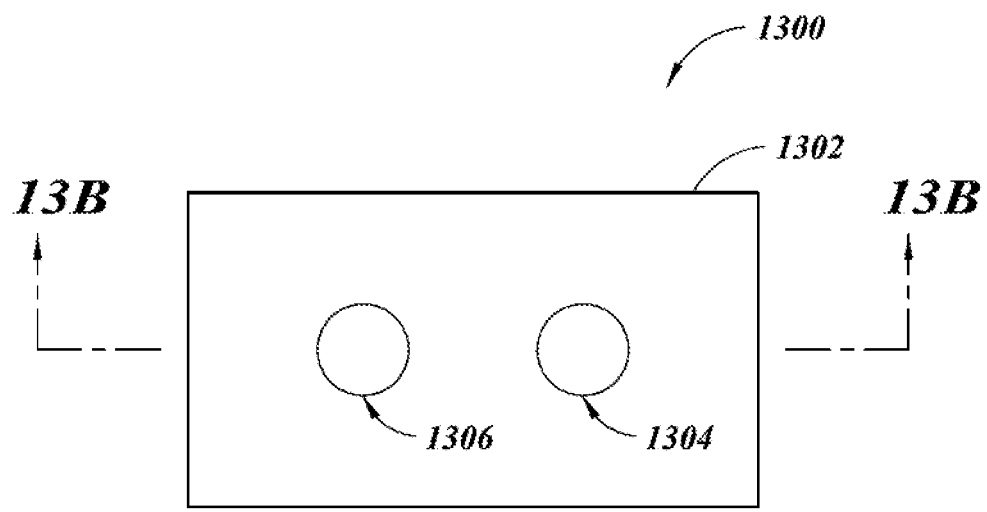
FIG. 13A is a top view of a proximity sensor cap, according to one embodiment.
Figure 13B:
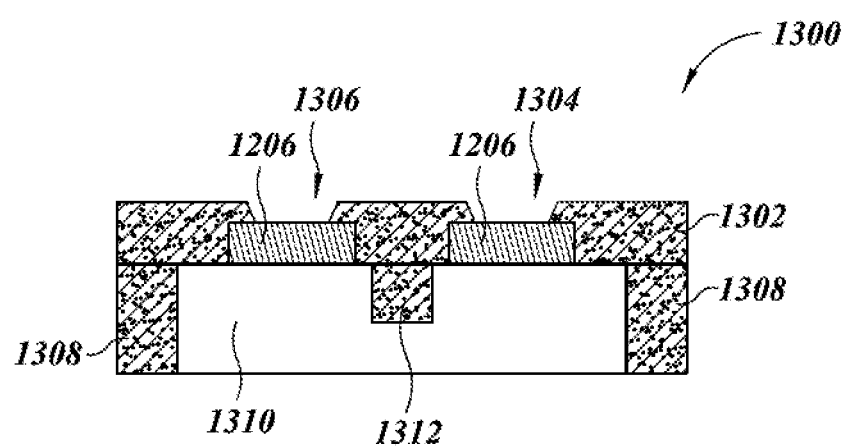
FIG. 13B is a cross-sectional view of the proximity sensor cap shown in FIG. 13A.

Additionally, the encapsulating layer 1216 is separated from the adhesion layer 1226 to form a plurality of proximity sensor caps 1300 (shown in FIGS. 13A and 13B). For example, at least a lower portion of the proximity sensor cap assembly 1200 that includes the adhesion layer 1226 is placed in a solvent such as water to separate the encapsulating layer 1216 from the adhesion layer 1226.

FIG. 13A is a top view of the proximity sensor cap 1300, according to one embodiment. The proximity sensor cap 1300 includes an upper portion 1302 formed from the encapsulating layer 1216. The upper portion 1302 includes a first aperture 1304 and a second aperture 1306 corresponding to a pair of the apertures 1222.

FIG. 13B is a cross-sectional view of the proximity sensor cap 1300 along the line 13B-13B shown in FIG. 13A. The proximity sensor cap 1300 includes a pair of first side walls 1308 formed from the cap feet 1230. The proximity sensor cap 1300 also includes a pair of second side walls 1310 formed from the cap feet 1234; only one of the side walls 1310 is shown in FIG. 13B. A light blocking member 1312 is formed from one of the cap feet 1232. The light blocking member 1312 extends from one of the side walls 1310 to an opposing side wall 1310 (not shown). In addition, the first side walls 1308 extend from one of the side walls 1310 to an opposing side wall 1310 (not shown).

Figure 14:
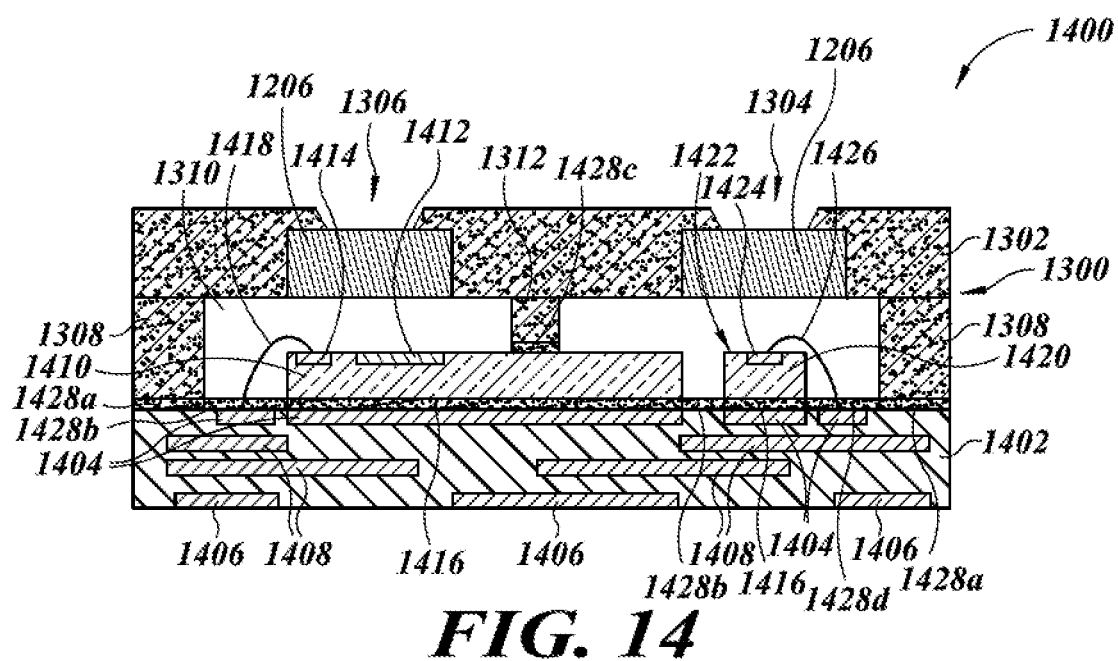
FIG. 14 is a cross-sectional view of a proximity sensor, according to one embodiment.

FIG. 14 is a cross-sectional view of a proximity sensor 1400, according to one embodiment. The proximity sensor 1400 includes a printed circuit board substrate 1402. An upper surface of the printed circuit board substrate 1402 includes a plurality of contact pads 1404. A lower surface of the printed circuit board substrate 1402 includes a plurality of contact pads 1406. A plurality conductive traces 1408 forms electrical connections between one or more of the contact pads 1404 on the upper surface of the printed circuit board substrate 1402 and one or more of the contact pads 1406 on the lower surface of the printed circuit board substrate 1402.

A conventional semiconductor die 1410 is disposed on the upper surface of the printed circuit board substrate 1402. An upper surface of the semiconductor die 1410 includes a sensor area 1412 and at least one contact pad 1414. A conventional conductive adhesive material 1416 forms an electrical connection between a lower surface of the semiconductor die 1410 and one of the contact pads 1404 on the upper surface of the printed circuit board substrate 1402. The conductive adhesive material 1416 also secures the semiconductor die 1410 to the printed circuit board substrate 1402. At least one wire 1418 forms at least one electrical connection between at least one of the contact pads 1404 on the upper surface of the printed circuit board substrate 1402 and the at least contact pad 1414 on the upper surface of the semiconductor die 1410. In one embodiment, conventional wire bonding machinery connects one end of the at least one wire 1418 to one of the contact pads 1404 on the upper surface of the printed circuit board substrate 1402 and then connects the other end of the wire 1418 to one of the at least one contact pad 1414 on the upper surface of the semiconductor die 1410.

A conventional light emitting device 1420 is disposed on one of the contact pads 1404 on the upper surface of the printed circuit board substrate 1402. In one embodiment, the light emitting device 1420 is a conventional light emitting diode (LED). In one embodiment, the light emitting device 1420 is a conventional vertical-cavity surface-emitting laser (VCSEL). The conductive adhesive material 1416 forms an electrical connection between a lower surface of the light emitting device 1420, which may include a contact pad, and the contact pad 1404 on the upper surface of the printed circuit board substrate 1402. The conductive adhesive material 1416 also secures the light emitting device 1420 to the printed circuit board substrate 1402.

An upper surface of the light emitting device 1420 includes a light emitting area 1422 and a contact pad 1424. A wire 1426 forms an electrical connection between the contact pad 1424 and one of the contact pads 1404 on the upper surface of the printed circuit board substrate 1402. In one embodiment, conventional wire bonding machinery connects one end of the wire 1426 to one of the contact pads 1404 on the upper surface of the printed circuit board substrate 1402 and then connects the other end of the wire 1426 to the contact pad 1424 on the upper surface of the printed circuit board 1420.

The proximity sensor 1400 also includes the proximity sensor cap 1300 shown in FIGS. 13A and 13B. The proximity sensor cap 1300 is secured to the printed circuit board substrate 1402 and the semiconductor die 1410. More particularly, an adhesive material 1428a secures the first side walls 1308 to the upper surface of the printed circuit board substrate 1402. An adhesive material 1428b secures the second side walls 1310 (only one shown in FIG. 14) to the upper surface of the printed circuit board substrate 1402. Additionally, an adhesive material 1428c secures the light blocking member 1312 to an upper surface of the semiconductor die 1410.

The lower surfaces of the first side walls 1308 and the second side walls 1310 are flat. The upper surface of the printed circuit board substrate 1402 also is flat. The adhesive material 1428a and the adhesive material 1428b do not permit light to pass therethrough. When the proximity sensor cap 1300 is secured to the printed circuit board substrate 1402, the upper portion 1302, the first side walls 1308, and the second side walls 1310 prevent external light from entering the proximity sensor 1400, other than light that passes through the lenses 1206.

In addition, the lower surface of the light blocking member 1312 and the upper surface of the semiconductor die 1410 are flat. The adhesive material 1428c does not permit light to pass therethrough. When the proximity sensor cap 1300 is secured to the printed circuit board substrate 1402 and the semiconductor die 1410, the light blocking member 1312 prevents light emitted by the light emitting device 1420 from reaching the sensor area 1412 of the semiconductor die 1410, other than light that exits the first aperture 1304, that is reflected by an object in the vicinity of the proximity sensor 1400, and that enters the second aperture 1306.

During operation of the proximity sensor 1400, electrical power is provided to the proximity sensor 1400 through one or more of the contact pads 1406 on the lower surface of the printed circuit board substrate 1402. The electrical power may be supplied to the semiconductor die 1410 via one or more of the conductive traces 1408 connected to one of the contact pads 1404 on the upper surface of the printed circuit board substrate 1402 that is connected by at least one wire 1418 to at least one contact pad 1414 on the upper surface of the semiconductor die 1410. A common reference potential (e.g., ground) may be provided to the proximity sensor 1400 through one or more of the contact pads 1406 on the lower surface of the printed circuit board substrate 1402. The common reference potential may be supplied to the semiconductor die 1410 via one or more of the conductive traces 1408 connected to one of the contact pads 1404 on the upper surface of the printed circuit board substrate 1402 that is connected to the lower surface of the semiconductor die 1410, which may include a contact pad.

Additionally, electrical power is supplied to the light emitting device 1420 via one of the contact pads 1404 on the upper surface of the printed circuit board substrate 1402, which is connected to the contact pad 1424 on the upper surface of the light emitting device 1420. The common reference potential is supplied to the light emitting device 1420 via the lower surface of the light emitting device 1420, which may include a contact pad that is coupled to one of the contact pads 1404 on the upper surface of the printed circuit board substrate 1402.

The proximity sensor 1400 provides data and/or control signals from one or more of the contact pads 1406 on the lower surface of the printed circuit board substrate 1402. Those contact pads 1406 are connected by one or more of the conductive traces 1408 to one or more of the contact pads 1404 on the upper surface of the printed circuit board substrate 1402, which also are connected by the at least one wire 1418 to at least one of the contact pads 1414 on the upper surface of the semiconductor die 1410. Only one such contact pad 1404, contact pad 1414, and wire 1418 is shown in FIG. 14B.

The light emitting device 1420 emits light through a first lens 1206 and the first aperture 1304 in the cover 1302. Light that is reflected by an object in the vicinity of the proximity sensor 1400 may enter the second aperture 1306 in the cover 1302, pass through a second lens 1206, and impact the sensor area 1412 of the semiconductor die 1410. The semiconductor die 1410 outputs one or more signals that are indicative of or proportional to the magnitude of the intensity of the light incident on the sensor area 1412, from the at least one contact pad 1414 on the upper surface of the semiconductor die 1410. The semiconductor die 1410 may include a driver that causes power to be supplied to the light emitting device 1420 at predetermined times.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A device, comprising:
  a first board substrate including a first surface and a second surface opposite to the first surface;
  a first die coupled to the first surface of the first board substrate, the first die including a third surface facing away from the first board substrate, a sensor area along the fourth third surface, and a plurality of sidewalls that are transverse to the third surface;
  a first lens on the third surface of the first die and overlapping the sensor area of the first die, the first lens including a plurality of sidewalls transverse to the third surface, and the plurality of sidewalls of the first lens are spaced inward from the plurality of sidewalls of the first die;

a die assembly coupled to the first board substrate and on the first board substrate, the die assembly including:
  a second die including a fourth surface facing away from the first board substrate and a light emitting area along the fourth surface;
  a plurality of sidewalls that are transverse to the first surface and extend from the fourth surface towards the first board substrate; and
  a second lens overlaps the second die and overlaps the light emitting area of the second die, the second lens includes a plurality of sidewalls transverse to the first surface;

a molding compound coupled to the first surface of the first board substrate, coupled to the plurality of sidewalls of the first die, coupled to the third surface of the first die, coupled to the plurality of sidewalls of the first lens, coupled to the plurality of sidewalls of the die assembly, and coupled to the plurality of sidewalls of the second lens.

2. The device of claim 1, wherein:
the second lens encloses the second die, covers the fourth surface of the second die, and covers a plurality of sidewalls of the second die transverse to the fourth surface of the second die; and
the die assembly further includes a second board substrate coupled to the first board substrate and coupled to the second die, and the second board substrate is between the second die and the first surface of the first board substrate.

3. The device of claim 2, further comprising a wire having a first end coupled to the light emitting area and a second end opposite to the first end coupled to the second board substrate.

4. The device of claim 3, wherein the molding compound is on a plurality of sidewalls of the second board substrate.

5. The device of claim 2, further comprising a third lens coupled to the second lens, the third lens is a filter that filters a predetermined wavelength to prevent the predetermined wavelength from passing through the third lens.

6. The device of claim 5, wherein the third lens is coupled to the second lens by a transparent adhesive.

7. The device of claim 1, wherein the first lens fully overlaps the sensor area of the first die.

8. The device of claim 1, wherein the second lens is coupled to the second die and fully overlaps a light emitting area of the second die.

9. The device of claim 8, wherein the second lens is a filter that filters a predetermined wavelength to prevent the predetermined wavelength from passing through the second lens.

10. A device, comprising:
a first board substrate including a first surface and a second surface opposite to the first surface;
a first die coupled to the first surface of the first board substrate, the first die including a third surface facing away from the first board substrate, a sensor area along the third surface, and a plurality of sidewalls that are transverse to the third surface;
a first lens on the first die and overlapping the sensor area of the first die, the first lens including a plurality of sidewalls transverse to the third surface, the plurality of sidewalls of the first lens are spaced inward from the plurality of sidewalls of the first die;

a die assembly coupled to the third surface of the first die and on the third surface of the first die, the die assembly including:
  a second die including a fourth surface facing away from the first board substrate and a light emitting area along the fourth surface;
  a second lens overlaps the second die and overlaps the light emitting area of the second die;
  a plurality of sidewalls that are transverse to the first surface and extend from the fourth surface towards the first board substrate, the second lens includes a plurality of sidewalls transverse to the first surface; and a molding compound coupled to the first surface of the first board substrate, coupled to the plurality of sidewalls of the first die, coupled to the third surface of the first die, coupled to the plurality of sidewalls of the first lens, coupled to the plurality of sidewalls of the die assembly, and coupled to the plurality of sidewalls of the second lens.

11. The device of claim 10, wherein:
the second lens encloses the second die, covers the fourth surface of the second die, and covers a plurality of sidewalls of the second die transverse to the fourth surface of the second die; and
the die assembly further includes a second board substrate coupled to the first die and coupled to the second die, and the second board substrate is between the first die and the second die.

12. The device of claim 11, further comprising a wire having a first end coupled to the light emitting area and a second end opposite to the first end coupled to the second board substrate.

13. The device of claim 12, wherein the molding compound is on a plurality of sidewalls of the second board substrate.

14. The device of claim 11, further comprising a third lens coupled to the second lens, the third lens is a filter that filters a predetermined wavelength to prevent the predetermined wavelength from passing through the third lens.

15. The device of claim 10, wherein second lens is coupled to the second die and fully overlaps the light emitting area of the second die.

16. The device of claim 15, wherein the second lens is a filter that filters a predetermined wavelength to prevent the predetermined wavelength from passing through the second lens.

17. A method, comprising:
forming a die assembly including coupling a first lens to a light emitting die;
coupling a light sensing die to a first board substrate;
coupling the die assembly to a surface of the light sensing die coupled to the first board substrate;
coupling a second lens to the light sensing die; and
encasing the light sensing die, the die assembly, and the second lens by forming a molding compound on and coupled to a surface of the first board substrate and covering, on, and coupled to respective sidewalls of the die assembly, the light sensing die, and the second lens.

18. The method of claim 17, wherein:
forming the die assembly further includes coupling the light emitting die to a surface of a second board substrate;
coupling the first lens to the light emitting die further includes forming a transparent material of the first lens on the surface of the second board substrate encasing the light emitting die between the transparent material of the second lens and the surface of the second board substrate; and coupling the die assembly to the light sensing die coupled to the first board substrate includes coupling the second board substrate of the die assembly to the light sensing die.

19. The method of claim 18, wherein forming the die assembly further includes coupling a third lens to the second lens by a transparent adhesive material, and the third lens is a filter that filters a predetermined wavelength to prevent the predetermined wavelength from passing through the third lens.

20. The method of claim 17, wherein:

coupling the first lens to the light emitting die includes coupling the first lens to a surface of the light emitting die by a transparent adhesive covering a light emitting region of the light emitting die, and the first lens is a filter that filters a predetermined wavelength to prevent the predetermined wavelength from passing through the first lens.

* * * * *

UNITED STATES PATENT AND TRADEMARK OFFICE
CERTIFICATE OF CORRECTION

PATENT NO. : 11,988,743 B2
APPLICATION NO. : 18/055138
DATED : May 21, 2024
INVENTOR(S) : Jing-En Luan et al.

Page 1 of 1

It is certified that error appears in the above-identified patent and that said Letters Patent is hereby corrected as shown below:

In the Claims

Column 20, Claim 1, Line 64:
"the fourth third surface,"
Should read:
--along the third surface,--.

Signed and Sealed this
Twenty-third Day of July, 2024

Katherine Kelly Vidal
*Director of the United States Patent and Trademark Office*